United States Patent
Huang et al.

(10) Patent No.: US 12,322,690 B2
(45) Date of Patent: Jun. 3, 2025

(54) CIRCUIT PACKAGES AND FABRICATION METHODS USING BOND-ON-PAD (BOP) SUBSTRATE TECHNOLOGY

(71) Applicant: Avago Technologies International Sales Pte. Limited., Singapore (SG)

(72) Inventors: Wen-Hsien Huang, Hsinchu (TW); Kwok Cheung Tsang, Irvine, CA (US)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 404 days.

(21) Appl. No.: 17/737,903

(22) Filed: May 5, 2022

(65) Prior Publication Data
US 2022/0367334 A1  Nov. 17, 2022

Related U.S. Application Data

(60) Provisional application No. 63/189,014, filed on May 14, 2021.

(51) Int. Cl.
| H01L 23/498 | (2006.01) |
| H01L 21/48 | (2006.01) |
| H01L 23/00 | (2006.01) |

(52) U.S. Cl.
CPC .... *H01L 23/49838* (2013.01); *H01L 21/4857* (2013.01); *H01L 21/4867* (2013.01); *H01L 23/49816* (2013.01); *H01L 23/49822* (2013.01); *H01L 24/13* (2013.01); *H01L 24/16* (2013.01); *H01L 24/32* (2013.01); *H01L 24/73* (2013.01);

(Continued)

(58) Field of Classification Search
CPC .......... H01L 23/49838; H01L 21/4857; H01L 23/49816; H01L 23/49822; H01L 24/13; H01L 24/16; H01L 24/32; H01L 24/73; H01L 24/81; H01L 2224/13582; H01L 2224/16227; H01L 2224/16238; H01L 2224/73204; H01L 2224/16013; H01L 2224/26175; H01L 2224/81385; H01L 2224/13083; H01L 2924/15153
See application file for complete search history.

(56) References Cited

U.S. PATENT DOCUMENTS

| 2004/0232562 A1* | 11/2004 | Hortaleza | H05K 1/111 257/737 |
| 2021/0098421 A1* | 4/2021 | Wu | H01L 23/49811 |
| 2021/0366864 A1* | 11/2021 | Fang | H01L 23/5384 |

OTHER PUBLICATIONS

Bae, et al., "Fine-Pitch, Low-vol. SoP (Solder-on-Pad) Process," 2012 IEEE 14th Electronics Packaging Technology Conference, pp. 723-727.

(Continued)

*Primary Examiner* — Douglas W Owens

(57) ABSTRACT

One or more implementations of the subject technology may enable a bond-on-pad (BoP) substrate technology that can eliminate the need to utilize a solder-on-pad (SoP) process. Unlike an SoP process, a BoP Process does not require a solder bump to be formed on a bump pad to attach a joint to a bump pad. The size of an opening on a bump pad for a BoP process may be larger than that of an SoP process. A BoP process may use a solder mask having multiple thicknesses and may be thinner near the bump pads. A BoP process may use a joint having a copper pillar and a solder cap. A BoP process can be used with an underfill or a molding compound technology.

20 Claims, 17 Drawing Sheets

(52) U.S. Cl.
CPC .... *H01L 24/81* (2013.01); *H01L 2224/13147* (2013.01); *H01L 2224/13582* (2013.01); *H01L 2224/13611* (2013.01); *H01L 2224/13639* (2013.01); *H01L 2224/13655* (2013.01); *H01L 2224/16227* (2013.01); *H01L 2224/16238* (2013.01); *H01L 2224/32225* (2013.01); *H01L 2224/73204* (2013.01); *H01L 2224/81815* (2013.01)

(56) References Cited

OTHER PUBLICATIONS

Kim, et al., "Reliability of Cu Pillar Bump for Flip Chip and 3-D SiP," Jul. 2008, 15th International Symposium on the Physical and Failure Analysis of Integrated Circuits, 5 pages.

Lau, "Status and Outlooks of Flip Chip Technology," Nov. 14, 2018, retrieved from https://smtnet.com/library/files/upload/flip-chip-technology-status.pdf, 16 pages.

Lin, et al., "Design and Characterization of a Copper-Pillar Flip Chip Test Vehicle for Small Form-Factor Packages Using 28mm ELK Die and Bump-On-Trace (BOT)," Dec. 2011, IEEE 6th International Microsystems, Packaging, Assembly and Circuits Technology Conference, pp. 218-221.

Wang, et al., "Reliability of Cu Pillar Bumps for Flip-Chip Packages with Ultra Low-k Dielectrics," 2010 Proceedings 60th Electronic Components and Technology Conference, pp. 1404-1410.

\* cited by examiner

| ITEMS | SoP (WITH SOLDER PASTE OR MICRO BALL) | BoP |
|---|---|---|
| CYCLE TIME AT SOLDER MASK | SINGLE STEP REQUIRES D DAYS | 2 STEP REQUIRES D+1 DAYS |
| CYCLE TIME AT BACKEND | D DAYS | D-4 DAYS (SKIP UBALL, REFLOW, FLUX CLEAN, BUMP COINING, BUMP AOI) |
| YIELD PERFORMANCE | YIELD LOSS AT BUMP AOI (BH/BD/COPLAN) | NO BUMP YIELD LOSS |
| SUBSTRATE MANUFACTURING COST | SoP PROCESS/MATERIAL/NRE-STENCIL | NO NEED OF SoP AND STENCIL, ADDING COST OF 2 STEP SOLDER MASK |
| KEY BOTTLENECK IN SUBSTRATE | SoP PROCESS | NO NEED OF SoP |

FIG. 9C

* D IS A POSITIVE INTEGER

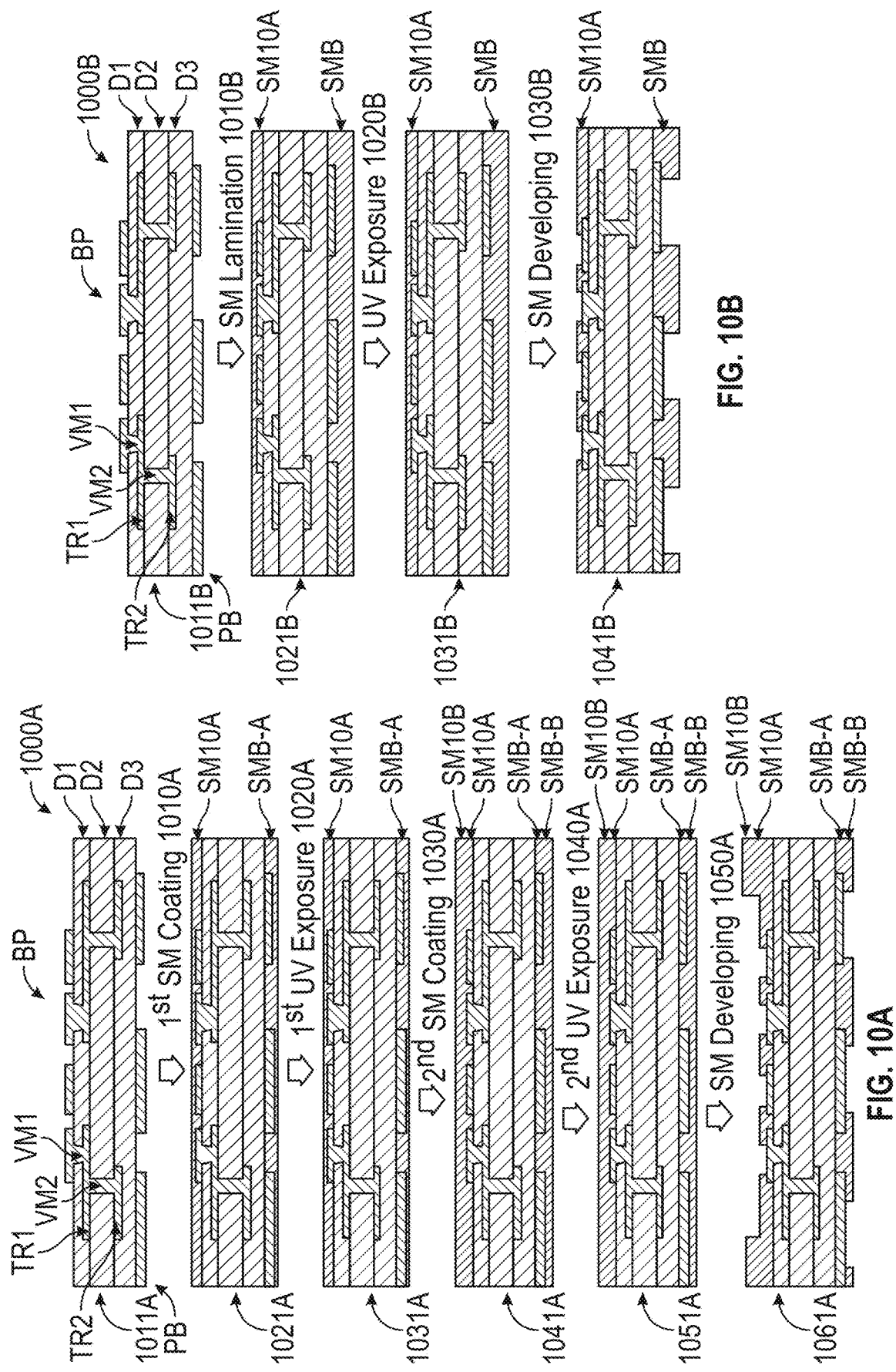

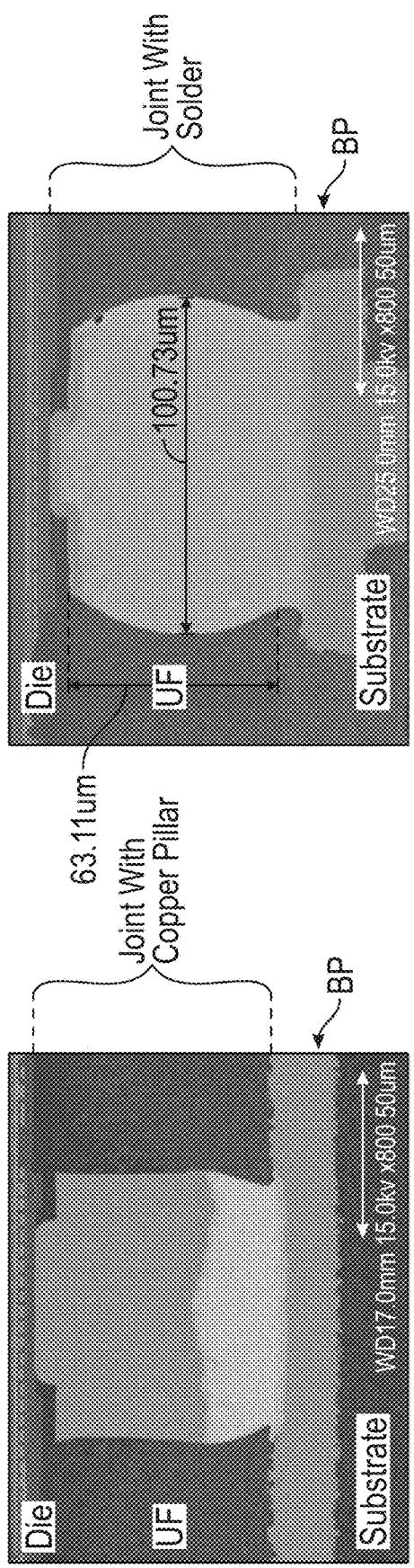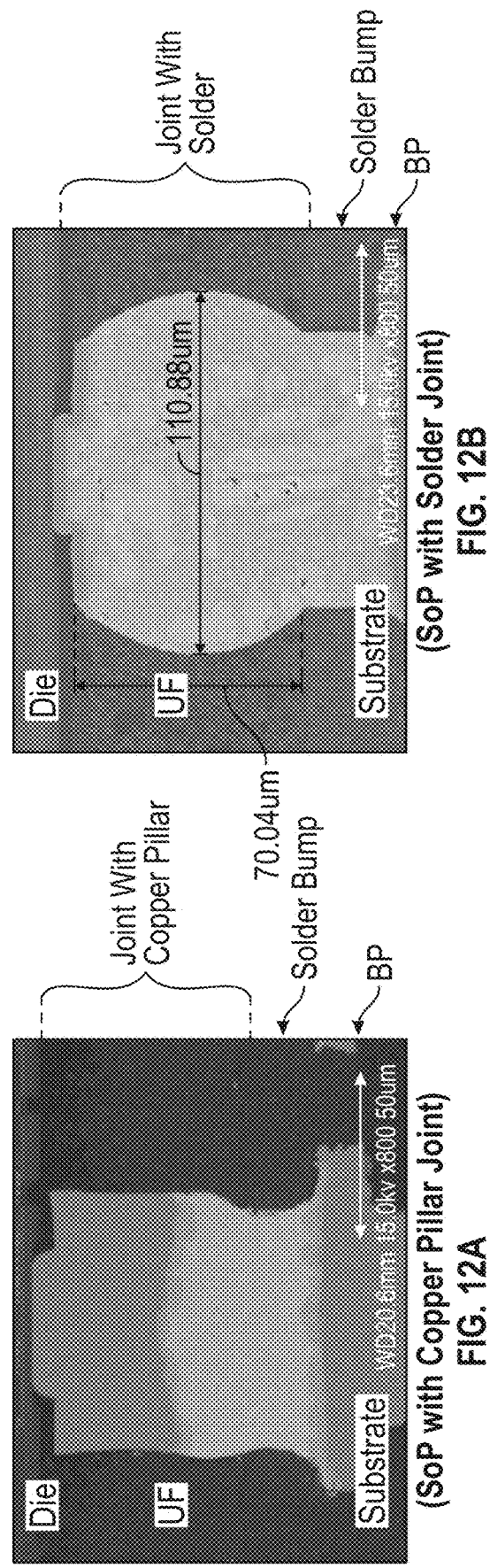
FIG. 11A (BoP with Copper Pillar Joint)
FIG. 11B (BoP with Solder Joint)
FIG. 12A (SoP with Copper Pillar Joint)
FIG. 12B (SoP with Solder Joint)

CIRCUIT PACKAGES AND FABRICATION METHODS USING BOND-ON-PAD (BOP) SUBSTRATE TECHNOLOGY

CROSS-REFERENCE TO RELATED APPLICATION

This application claims the benefit of U.S. Provisional Application No. 63/189,014, filed on May 14, 2021, the entirety of which is incorporated herein by reference for all purposes.

TECHNICAL FIELD

The present description relates generally to circuit packages and fabrication methods, including, without limitation, circuit packages and fabrication methods using bond-on-pad substrate technology.

BACKGROUND

Current chip packages such as flip-chip packages require solder-on-pad (SoP) on a substrate for joints such as controlled collapse-chip-connection (C4) bump joints. Existing SoP technology uses either solder paste printing or microball placement. SoP, however, involves high process and material costs, requires a long process flow and cycle time, and suffers from an extra yield loss due to missing bumps and failure to meet the dimensional tolerances.

The description provided in the background section should not be assumed to be prior art merely because it is mentioned in or associated with the background section. The background section may include information that describes one or more aspects of the subject technology.

BRIEF DESCRIPTION OF THE DRAWINGS

FIG. 9C is a table illustrating a comparison between process aspects of SoP and BoP.

FIG. 10A illustrates a flow diagram of an example of fabrication operations for a substrate using the BoP technology.

FIG. 10B illustrates a flow diagram of another example of fabrication operations for a substrate using the BoP technology.

FIGS. 11A and 11B illustrate examples of cross-sectional pictures of a portion of a circuit package fabricated using the BoP technology.

FIGS. 12A and 12B illustrate examples of cross-sectional pictures of a portion of a circuit package fabricated using the SoP technology.

Figure 1A:
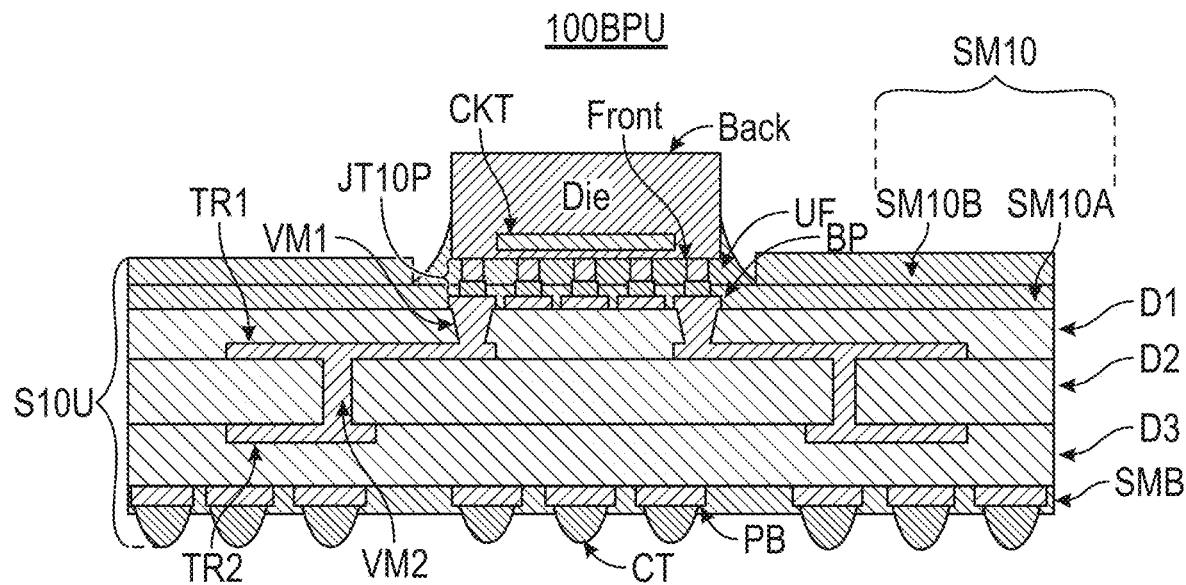
FIG. 1A illustrates a cross-sectional view of an example of a circuit package using bond-on-pad (BoP), pillar joint and underfill technologies.

In the drawings, like reference numbers may generally indicate identical, functionally similar, and/or structurally similar elements. In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive. Furthermore, for ease of illustration, the same or similar components are illustrated with the same or similar reference numbers. The descriptions provided with respect to a component with a given reference number in one or more figures may be applicable to a component with the same given reference number shown in one or more other figures unless stated otherwise or other descriptions are provided.

In one or more embodiments, the subject technology implements a bond-on-pad (BoP) substrate technology, which can, among others, reduce substrate manufacturing costs, shorten manufacturing cycle time and lead time, improve manufacturing yield, and eliminate the SoP capacity constraint. In one or more aspects, the subject technology obviates the need to utilize a solder-on-pad (SoP) process.

FIGS. 1A through 4B, 9B, 9C (third column), 10A, 10B, 11A and 11B illustrate one or more implementations of the subject technology utilizing BoP. FIGS. 5A through 8B, 9A, 9C (second column), 10C, 12A and 12B illustrate circuit packages or substrates fabricated utilizing SoP.

An SoP process requires forming a solder bump (e.g., SDR20 of FIG. 5C or SDR20' of FIG. 7C below) on each bump pad (e.g., BP of FIG. 5C or FIG. 7C) of a substrate in order to attach a joint (e.g., JT20C of FIG. 5C or JT20S of FIG. 7C) to the respective bump pad. Thus, a solder bump is formed on a respective bump pad before a joint can be attached to the respective bump pad.

A BoP process, on the other hand, does not require a solder bump to be formed on a bump pad. Each bump pad (e.g., BP of FIG. 1C or FIG. 3C below) using a BoP process is not covered by solder or is covered by less than 2 microns of solder (in thickness) on the bump pad before a joint (e.g., JT10P of FIG. 1C or JT10S of FIG. 3C) is attached to its respective bump pad. Thus, in a BoP process, a solder bump (e.g., SDR20 of FIG. 5C or SDR20' of FIG. 7C) is not needed to attach a joint to its respective bump pad.

In one or more aspects, a bump pad (e.g., BP) may be a contact pad (e.g., a conductive pad) on a substrate. A bump pad may be configured to receive a joint (which has been formed on a die) and be attached to the joint in order to form a circuit package (e.g., 100BPU of FIG. 1A, 100BPM of FIG. 2A, 100BSU of FIG. 3A, 100BSM of FIG. 4A, etc.). A circuit package may include a die, joints and a substrate when the die is mounted to the substrate using the joints.

In one or more implementations, the size of an opening (e.g., SMO10A of FIG. 1C or SMO10A' of FIG. 3C) on a bump pad for a BoP process is larger than the size of an opening (e.g., SMO20 of FIG. 5C or SMO20' of FIG. 7C) on a bump pad for an SoP process. An opening for a BoP process may be used to receive a joint and attach the joint to a bump pad. An opening for an SoP process is used to form a solder bump on a bump pad.

In one or more implementations, the thickness (T10A-1 of FIG. 1C or T10A-1' of FIG. 3C) of a solder mask on or over a bump pad for a BoP process may be thinner than a thickness (T20-1 of FIG. 5C or T20-1' of FIG. 7C) of a solder mask on or over a bump pad for an SoP process. Thus, a solder mask (e.g., SM10A of FIG. 1C or FIG. 3C) disposed on or over a bump pad (e.g., a first portion of BP in FIG. 1C or 3C) for a BoP process is thinner than a solder mask (e.g., SM20 of FIG. 5C or FIG. 7C) disposed on or over a bump pad (e.g., a first portion of BP in FIG. 5C or 7C) for a SoP process. Furthermore, the thickness (T10-1 of FIG. 1C or T10-1' of FIG. 3C) of a solder mask near a bump pad for a BoP process may be thinner than a thickness (T20-2 of FIG. 5C or T20-2' of FIG. 7C) of a solder mask near a bump pad for an SoP process.

A solder mask for a BoP process may have multiple thicknesses such as a first thickness and a second thickness. The first thickness (e.g., T10-1 of FIG. 1C or T10-1' of FIG. 3C) may be less than the second thickness (e.g., T10-2 of FIG. 1C or T10-2' of FIG. 3C). The first thickness may be closer to a bump pad than the second thickness. A solder mask for BoP may have multiple solder mask layers (e.g., SM10A and SM10B of FIGS. 1C and 3C). Such solder mask may be used for a circuit package utilizing an underfill (e.g., UF of FIGS. 1A and 3A).

When a BoP process is used for a circuit package utilizing a molding compound to encapsulate a die, a solder mask (e.g., SM10A of FIG. 2A or 4A) for the BoP process may include a single layer (rather than multiple layers) and may be thinner than a solder mask (e.g., SM20 of FIG. 6A or 8A) for an SoP process.

A solder mask (e.g., SM20 of FIGS. 5A, 5C, 6A, 7A, 7C, 8A) for the SoP process may utilize a single layer and may have a constant thickness over the entire underlying dielectric layer (e.g., D1).

In one or more aspects, utilizing a BoP technology can eliminate the need to use a SoP process, thereby reducing cost and cycle time. This also provides additional capacity in substrate manufacturing as SoP is a primary capacity constraint in substrate manufacturing. BoP provides an efficient solution for flip chip packages. A BoP technology can provide smaller body size and cost effective packages in comparison to SoP. Another substrate technology may utilize a bond on trace (BoT) process. This process, however, is not suitable for flip chip packages (e.g., flip chip ball grid array packages) with a matrix and full array design. BoT is only suitable for a peripheral wafer design. BoP, on other hand, can be used for a matrix and full array design. BoP can be used anywhere on a die (e.g., central or middle regions as well as peripheral regions of a die).

Figure 1B:
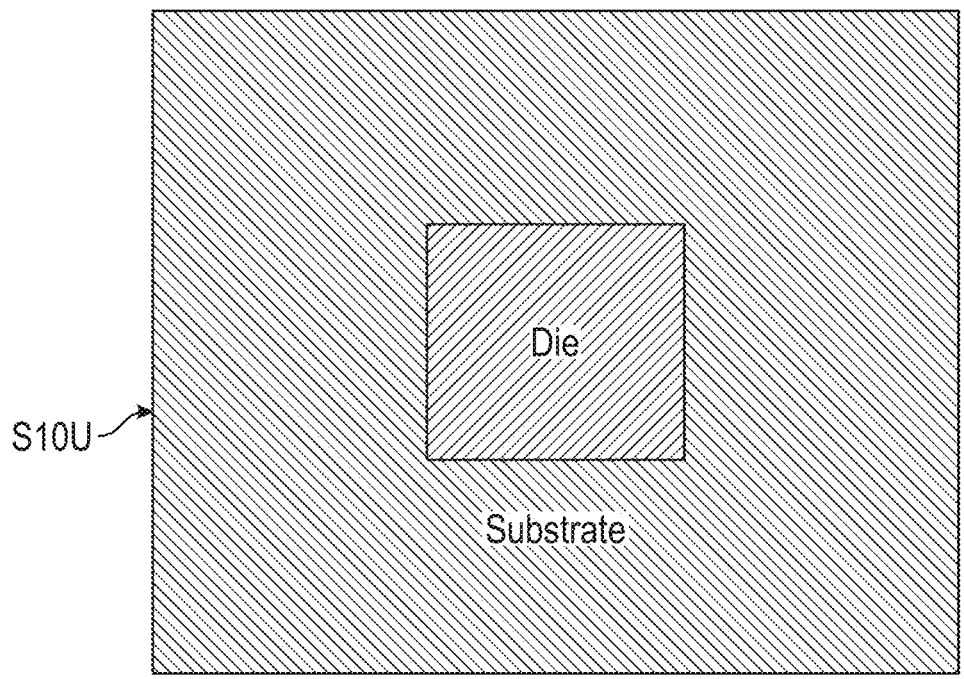
FIG. 1B illustrates an example of a planar top view of the circuit package depicted in FIG. 1A.

FIG. 1A illustrates a cross-sectional view of an example of a circuit package using BoP, pillar joint and underfill technologies. FIG. 1B illustrates an example of a planar top view of the circuit package depicted in FIG. 1A.

A circuit package 100BPU may include a die, joints JT10P, a substrate S10U, and an underfill UF. The die may have a front surface and a back surface. The die may include circuits CKT at or near the front surface. The circuits may include active components (e.g., transistors) and passive components (e.g., resistors, capacitors, inductors, insulators and conductors such as conductive traces, vias and conductive pads). In some examples, the die may include other circuits at or near the back surface. Such other circuits may be passive components. In other examples, such other circuits may also include active components. In one or more examples, the number of circuits at or near the front surface is greater than the number of circuits at or near the back surface. When the front surface of a die is flipped as shown in FIG. 1A and is located below the back surface, a die may be a flip chip die, and a circuit package may be a flip chip package.

The substrate S10U may include a solder mask SM10 on or at a top side, one or more dielectric layers D1-D3 in the middle, another solder mask SMB on or at a bottom side, and connectors CT (e.g., solder balls) at the bottom side. The substrate S10U may include bump pads BP, via metals VM1 and VM2, conductive traces TR1 and TR2, and pads PB at the bottom, each of which includes conductive materials. A bump pad BP may be connected to a via metal VM1, which is connected to a conductive trace TR1, which is connected to a via metal VM2, which is connected to a conductive trace TR2, which is connected to another via metal (not shown), which is connected to a pad PB, which is connected to a connector CT. A bump pad BP may be a conductive pad. The bump pads BP are disposed on the dielectric layer D1.

The joints JT10P may be located between the front surface of the die and the bump pads BP (e.g., central exposed portions of the bump pads BP).

A circuit package manufacturing process may involve (i) fabricating a substrate (e.g., by a substrate manufacturer), (ii) fabricating a die (e.g., by a chip foundry), (iii) forming joints on the die (e.g., by an assembler), (iv) attaching the die with the joints to the substrate (e.g., by an assembler), and (v) forming an underfill (e.g., by an assembler). In some examples, the tasks of an assembler may be carried out by a substrate manufacturer. In other examples, the tasks described above may be carried out by one or more of the entities mentioned above and/or one or more other entities. The process (ii) above may be performed prior to the process (iii) above. The process (i) and the processes (ii) and (iii) may be performed independently or performed serially or in parallel. If performed serially, the process (i) may be performed before the processes (ii) and (iii), or vice versa.

Figure 1C:
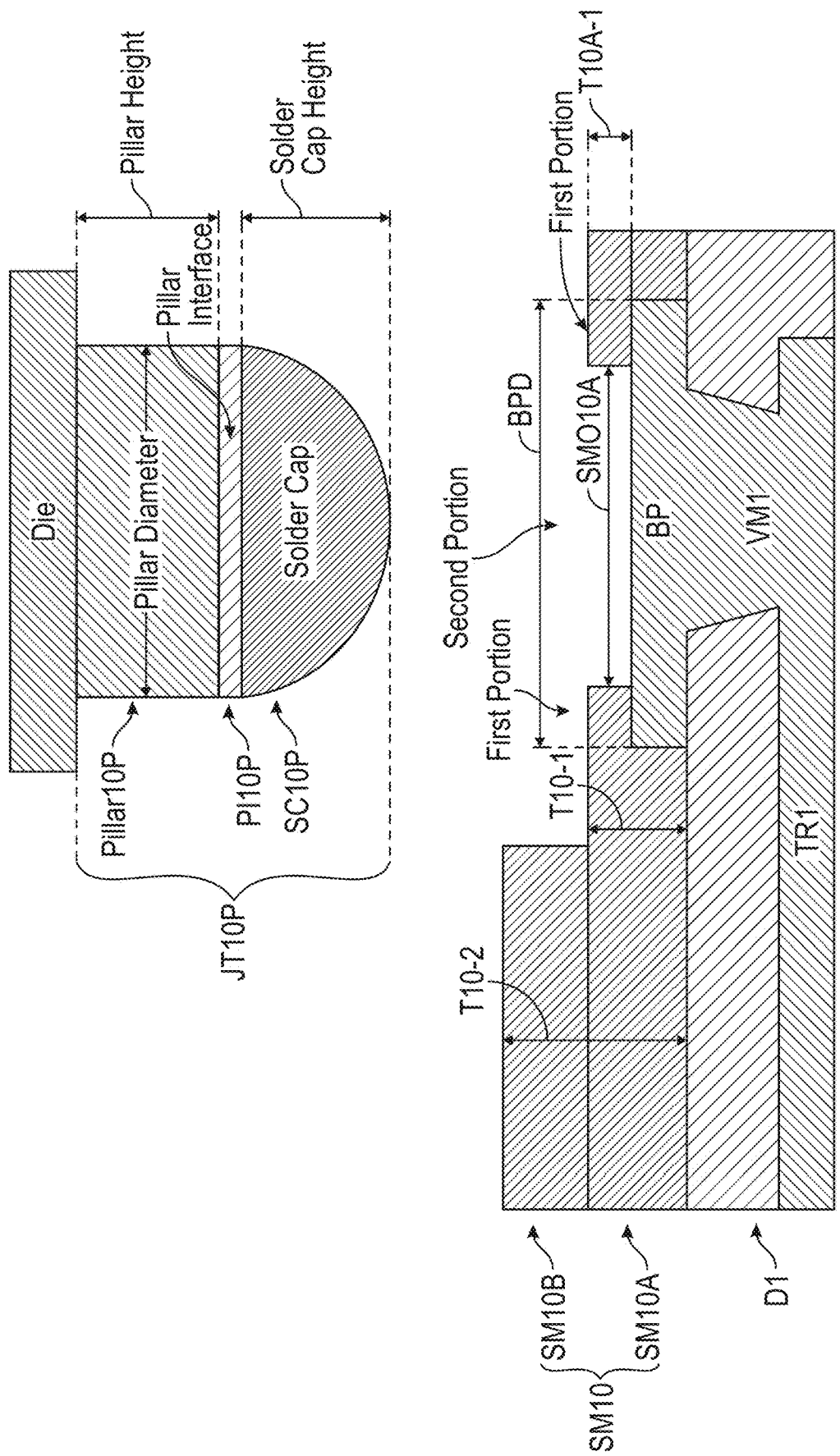
FIG. 1C illustrates a cross-sectional view of an example of components forming a portion of the circuit package depicted in FIG. 1A.

FIG. 1C illustrates a cross-sectional view of an example of components forming a portion of the circuit package depicted in FIG. 1A. FIG. 1C illustrates a state where a joint JT10P is formed on a die, and the joint JT10P is not yet attached to a bump pad BP.

In FIG. 1C, a joint JT10P is formed on the front surface of the die prior to being attached to a second portion (or an exposed portion) of a bump pad BP. Prior to each joint JT10P being attached to the second portion of the respective bump pad BP, the second portion of each respective bump pad BP is not covered by any solder or is covered by less than 2 microns (μm) of solder. Solder may include, for example: (i) tin or (ii) tin and silver. A bump pad BP may include conductive material. In some examples, prior to each joint JT10P being attached to the second portion of the respective bump pad BP, each bump pad BP contains no solder. In some examples, prior to each joint JT10P being attached to the second portion of the respective bump pad BP, each bump pad BP contains no tin. In some examples, each bump pad BP (or the second portion of each bump pad BP) may be covered by a surface finish layer including a material such as immersion tin or organic solderability preservative (OSP) before a joint is attached to the bump pad. A surface finish layer's thickness may be, for example, between 1 micron and 2 microns. In one or more examples, when a joint JT10P is attached to a respective bump pad BP, a center of the joint JT10P aligns or substantially aligns with a center of the respective bump pad BP.

The solder mask SM10 (e.g., a first solder mask layer SM10A) is disposed on the dielectric layer D1. The solder mask SM10 (e.g., a first solder mask layer SM10A) may cover a first portion of each bump pad BP and uncover (or expose) a second portion of each bump pad BP. A second portion may be an exposed central portion of each bump pad BP that allows a respective joint JT10P to be attached to a respective bump pad BP via a respective first opening SMO10A in the solder mask SM10. The first solder mask layer SM10A may occupy spaces between the bump pads.

The solder mask SM10 may include a second solder mask layer SM10B, which is disposed on the first solder mask layer SM10A. The second solder mask layer SM10B does not occupy spaces between the bump pads. The first solder mask layer SM10A has a first opening SMO10A in the second portion of each bump pad BP. A size of each first opening SMO10A is smaller than a size of a respective bump pad BP. The second solder mask layer SM10B has a second opening over all of the bump pads BP. A size of the second opening is larger than the size of a first opening and is larger than the size of a bump pad. A size of the second opening is larger than a sum of the sizes of the first openings and is larger than a sum of the sizes of all of the bump pads.

The solder mask SM10 may have a first thickness (e.g., T10-1) and a second thickness (e.g., T10-2), each measured from the dielectric layer D1 (or measured from the top surface of the dielectric layer DD. The first thickness is less than the second thickness. Portions of the solder mask SM10 having the first thickness are closer to the bump pads BP than portions of the solder mask SM10 having the second thickness. Neither the first thickness nor the second thickness is a thickness (e.g., T10A-1) of a solder mask SM10 on or over a bump pad BP (or on or over a first portion of a bump pad BP).

Figure 5A:
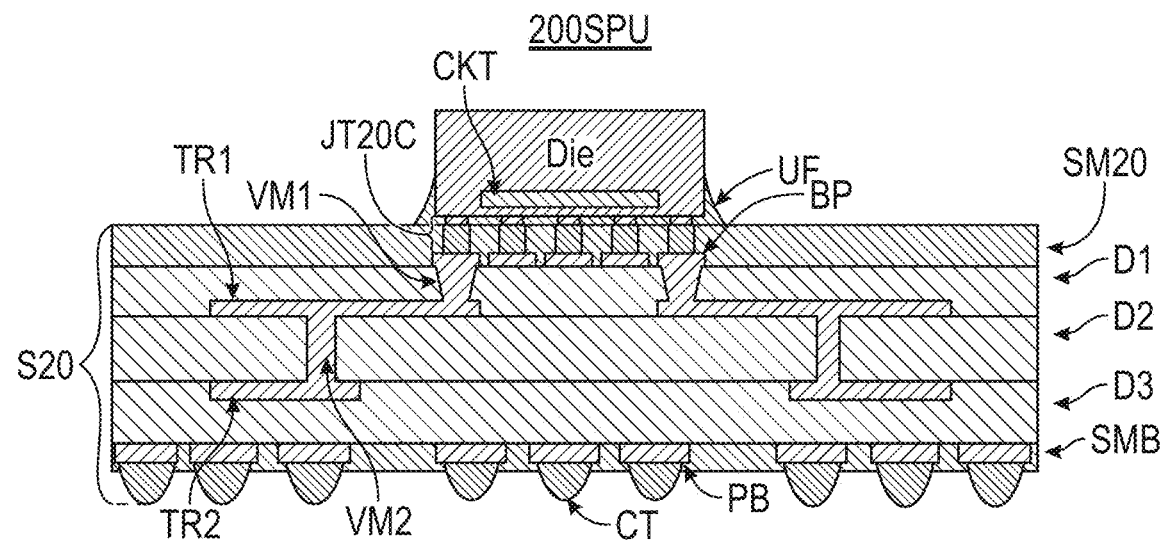
FIG. 5A illustrates a cross-sectional view of an example of a circuit package using solder-on-pad (SoP), pillar joint and underfill technologies.
Figure 5B:
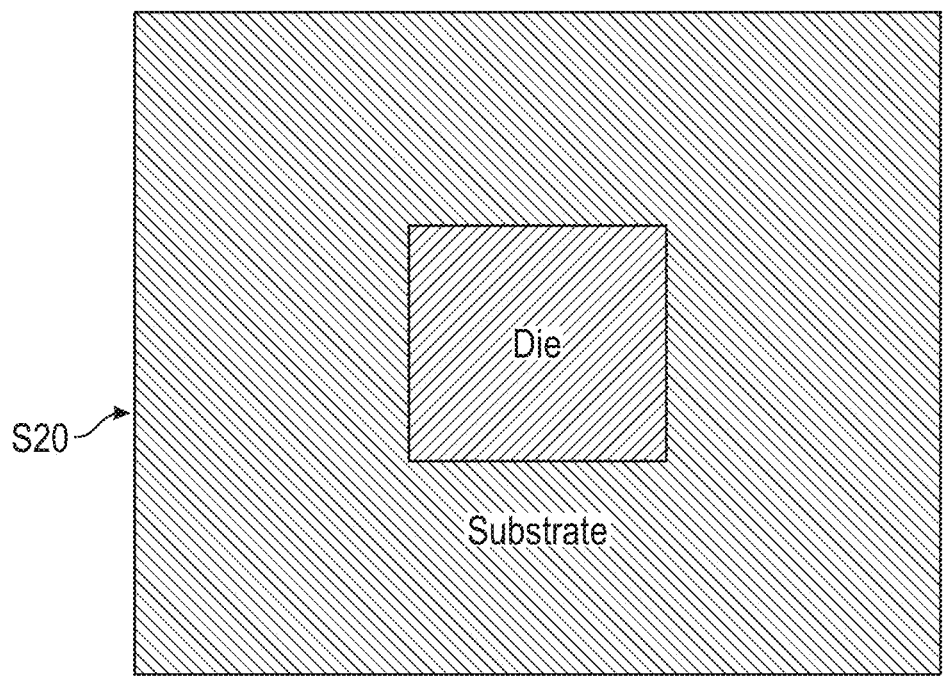
FIG. 5B illustrates an example of a planar top view of the circuit package depicted in FIG. 5A.
Figure 5C:
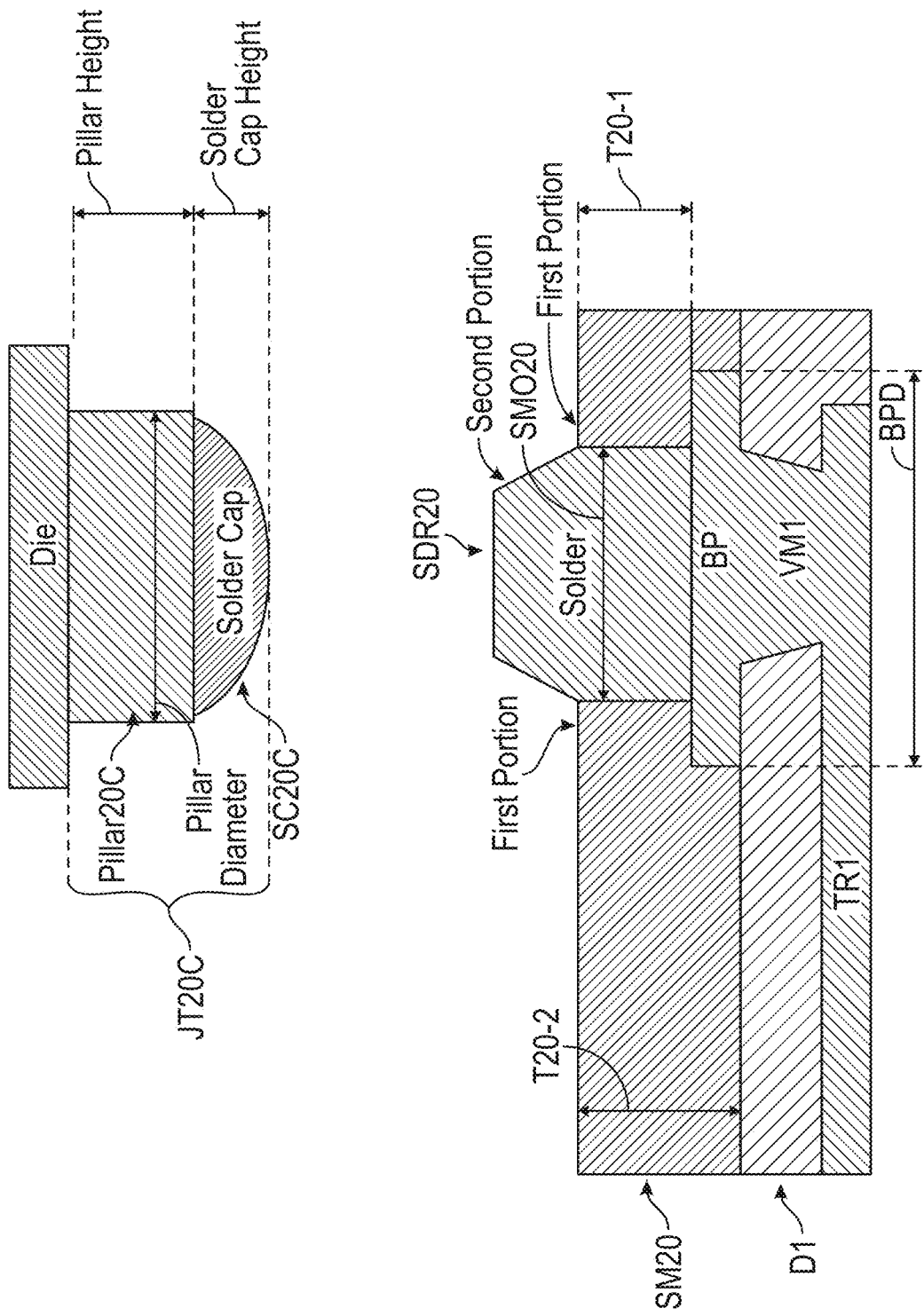
FIG. 5C illustrates a cross-sectional view of an example of components forming a portion of the circuit package depicted in FIG. 5A.

A thickness T10A-1 of the first solder mask layer SM10A over the first portion of a bump pad BP shown in FIG. 1C may be less than a thickness T20-1 of a solder mask SM20 over a first portion of a bump pad BP shown in FIG. 5C.

The underfill UF of FIG. 1A may occupy spaces between all of the joints JT10P. The underfill UF may occupy an opening (e.g., the second opening) in the second solder mask layer SM10B. The underfill UF may be disposed on the first solder mask layer SM10A. An underfill UF may be a capillary underfill.

Each joint JT10P may be formed on the front surface of the die before the joint JT10P is attached to the second portion (e.g., exposed portion) of a respective bump pad BP. A joint JT10P may include conductive material. A joint JT10P may include a first region having a pillar Pillar10P, a second region having solder SC10P, and a third region having a pillar interface PI10P. The solder SC10P may be referred to as a solder cap. The first region or the pillar Pillar10P may be formed on the front surface of the die (e.g., by being formed on a conductive pad (not shown) on the front surface of the die). The second region or the solder SC10P may be located away from the front surface of the die. The third region or the pillar interface PI10P may be disposed between the first and second regions. In another example, a joint JT10P may include a pillar and a solder cap without a pillar interface.

The pillar Pillar10P may include copper and may be a copper pillar. In some examples, the pillar's diameter may be the largest diameter of a joint JT10P. The solder SC10P may include solder (e.g., tin, or tin and silver). The pillar interface PI10P may include nickel.

Figure 2A:
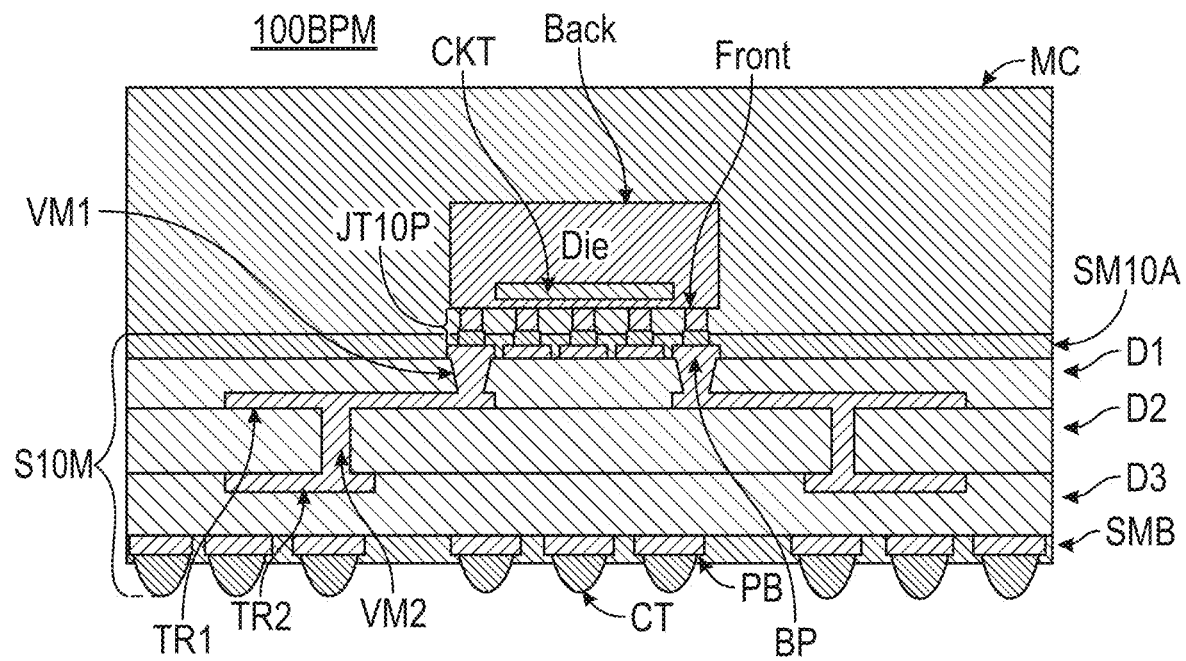
FIG. 2A illustrates a cross-sectional view of an example of a circuit package using BoP, pillar joint and molding compound technologies.
Figure 2B:
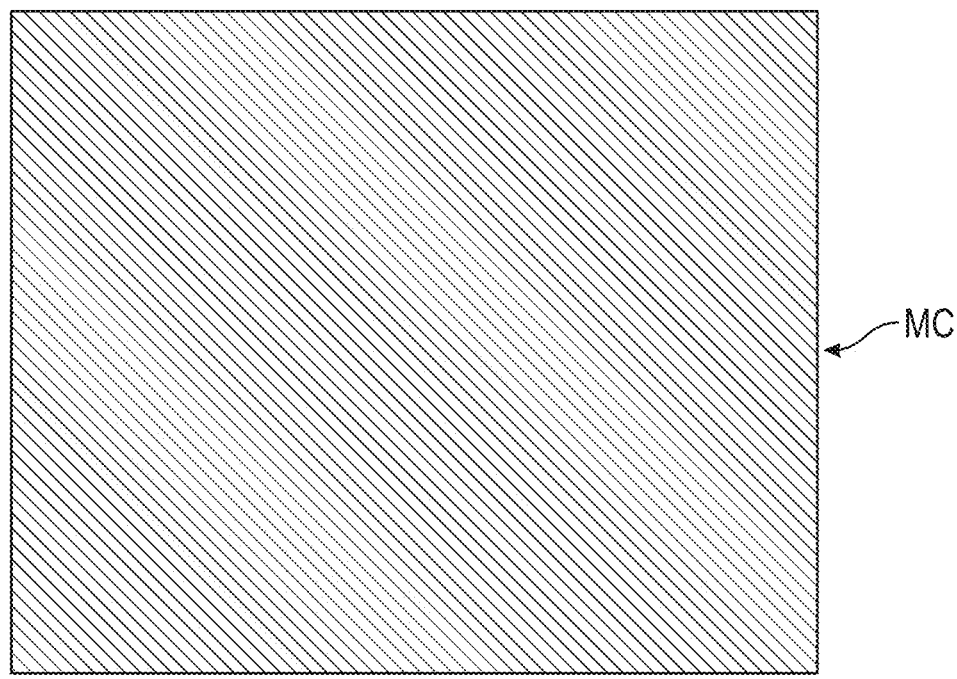
FIG. 2B illustrates an example of a planar top view of the circuit package depicted in FIG. 2A.

FIG. 2A illustrates a cross-sectional view of an example of a circuit package using BoP, pillar joint and molding compound technologies. FIG. 2B illustrates an example of a planar top view of the circuit package depicted in FIG. 2A. The basic structure and characteristics of a circuit package 100BPM of FIG. 2A are the same or substantially similar to those of the circuit package 100BPU of FIG. 1A, except as described herein.

The circuit package 100BPM of FIG. 2A has a molding compound MC instead of an underfill UF. The molding compound MC encapsulates the die. The molding compound is disposed on a solder mask at or near the top side of a substrate S10M. The solder mask of FIG. 2A at or near the top side of the substrate S10M includes a first solder mask layer SM10A. The solder mask of FIG. 2A at or near the top side of the substrate S10M does not include a second solder mask layer SM10B of FIGS. 1A and 1C. Thus, the solder mask at or near the top side of the substrate S10M of FIG. 2A is thinner than the solder mask SM10 of FIGS. 1A and 1C. The molding compound MC occupies spaces between all of the joints JT10P. During a manufacturing process of the circuit package 100BPM of FIG. 2A, the molding compound MC may be formed instead of the underfill.

Some examples of dimensions and materials of the various components shown in FIGS. 1A, 1C and 2A are provided in Table 1 below. An example of a dimension between X microns and Y microns may be expressed as a dimension of X microns to Y microns, where X and Y are numbers.

TABLE 1

| Component | Example Dimensions | Example Materials |
|---|---|---|
| Pillar (Pillar10P) | Pillar diameter (or pillar's largest diameter): 80 microns; or 70 microns to 90 microns<br>Pillar height: 40 microns; or 25 microns to 55 microns | copper; or 99% copper |
| Pillar Interface (PI10P) | Pillar interface height: 5 microns; or 3 microns to 7 microns | nickel |
| Solder Cap (SC10P) | Solder cap height: 30 microns; or 15 microns to 40 microns; and greater than the solder cap height of SC20C of FIG. 5C | tin; or tin and silver |
| Bump Pad Diameter (BPD) (or Its Lateral Width, Lateral Length or Lateral Size) | BP diameter (BPD): 100 microns; or 80 microns to 110 microns | copper |
| Thickness of Bump Pad (BP) | Thickness of BP: 15 microns; or 8 microns to 23 microns | copper |
| First Opening (SMO10A) of First Solder Mask Layer (SM10A) | SMO10A: 75 microns; or 60 microns to 90 microns; and larger than SMO20 of FIG. 5C | N/A |
| First Thickness (T10-1) of Solder Mask (SM10) | T10-1: 27 microns; or 15 microns to 30 microns | N/A |
| Second Thickness (T10-2) of Solder Mask (SM10) | T10-2: 35 microns; or 25 microns to 40 microns | N/A |
| Thickness (T10A-1) of First Solder Mask Layer over First Portion of Bump Pad | T10A-1: 12 microns; or 5 microns to 15 microns; and less than T20-1 of FIG. 5C | N/A |
| First Solder Mask Layer (SM10A) | N/A | dielectric; or solder resist |
| Second Solder Mask Layer (SM10B) | N/A | dielectric; or solder resist |
| Dielectric Layer (DI, D3, D3) | Each of D1-D3: 30 microns; or 15 microns to 50 microns | dielectric |
| Via Metals (VM1, VM2) | N/A | copper |
| Traces (TR1, TR2) | N/A | copper |
| Solder Mask (SMB) at Bottom Side | Thickness of SMB: 20 microns; or 10 microns to 30 microns | dielectric; or solder resist |
| Pads at Bottom (PB) | N/A | copper |
| Connector (CT) | N/A | solder; tin; tin and silver; or tin, silver and copper |
| Underfill (UF) | N/A | epoxy resin and silicon filler |
| Molding Compound (MC) | N/A | epoxy resin and silicon filler |
| Lateral gap between a joint (JT10P) and an adjacent joint (JT10P) | Lateral gap between two adjacent joints (JT10P): 50 microns; or 30 microns to 70 microns | N/A |

Figure 3A:
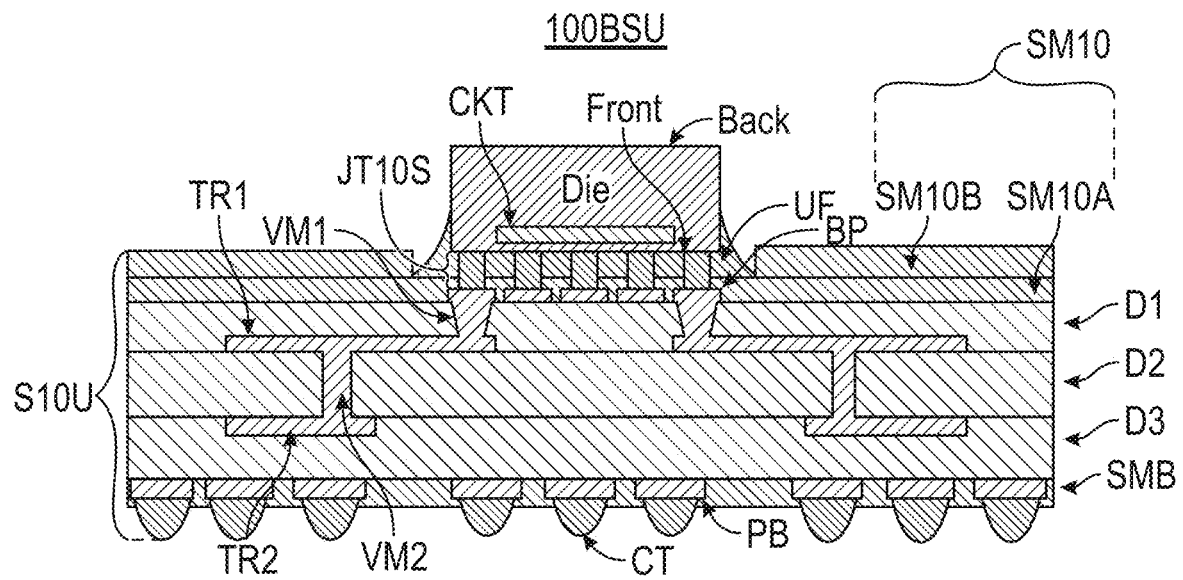
FIG. 3A illustrates a cross-sectional view of an example of a circuit package using BoP, solder joint and underfill technologies.
Figure 3B:
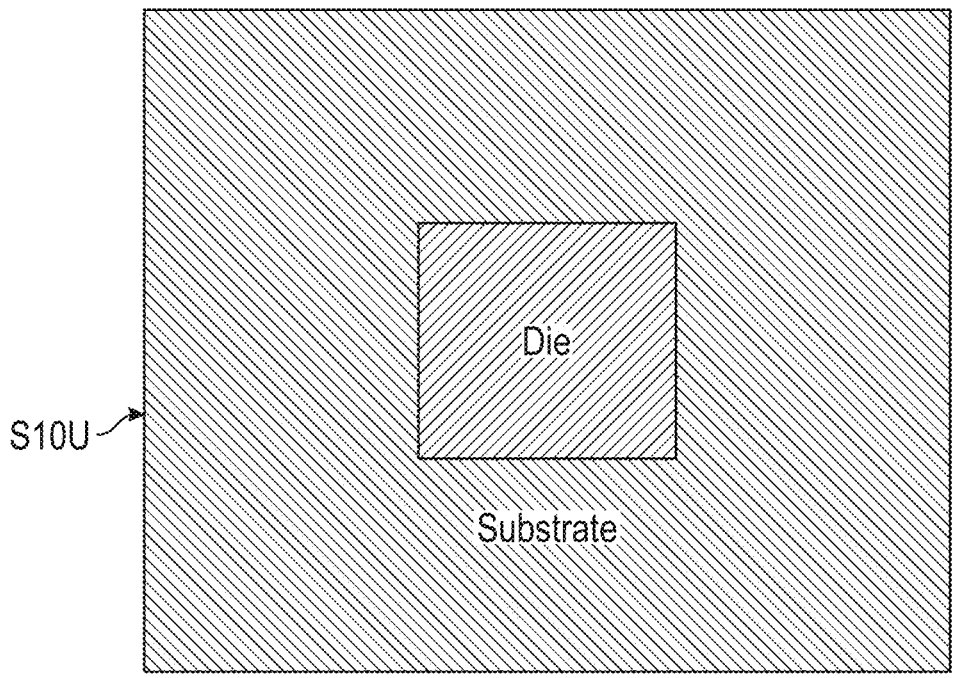
FIG. 3B illustrates an example of a planar top view of the circuit package depicted in FIG. 3A.
Figure 3C:
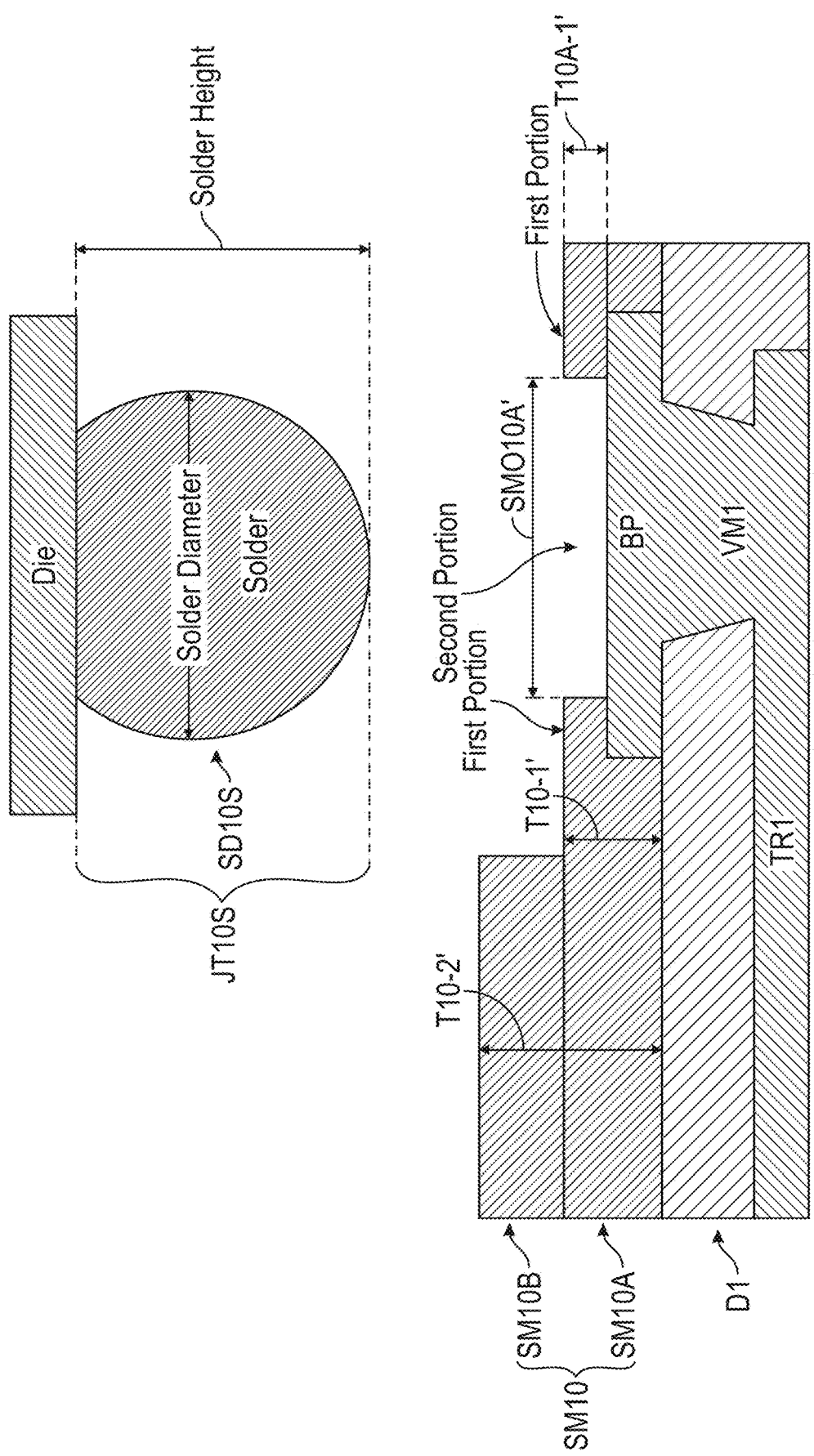
FIG. 3C illustrates a cross-sectional view of an example of components forming a portion of the circuit package depicted in FIG. 3A.
Figure 4A:
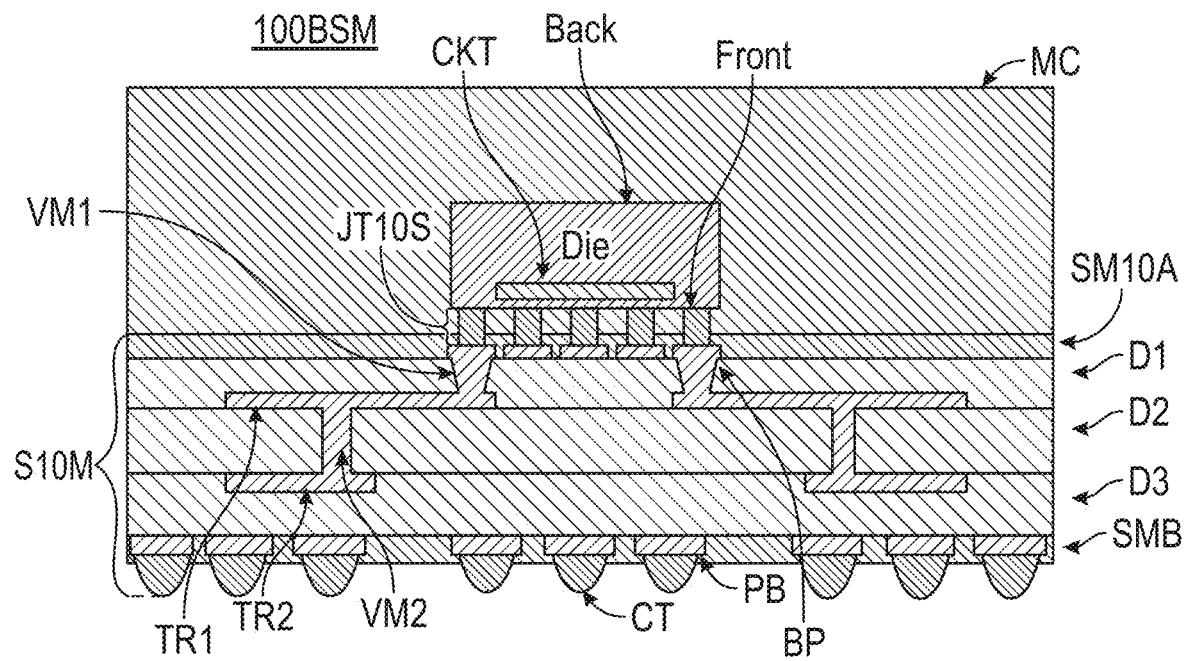
FIG. 4A illustrates a cross-sectional view of an example of a circuit package using BoP, solder joint and molding compound technologies.
Figure 4B:
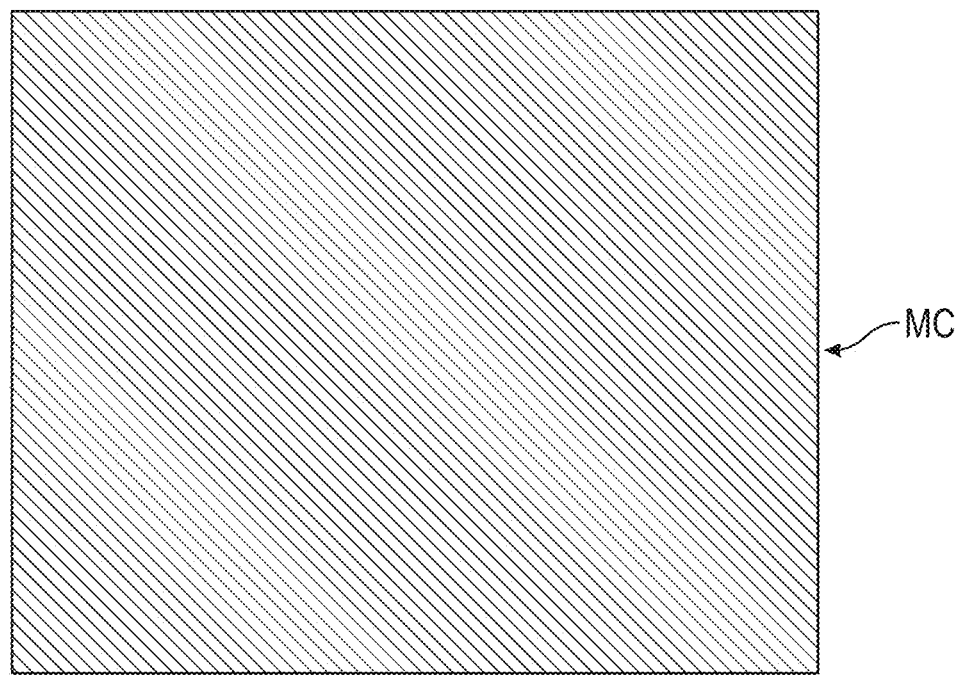
FIG. 4B illustrates an example of a planar top view of the circuit package depicted in FIG. 4A.

FIG. 3A illustrates a cross-sectional view of an example of a circuit package using BoP, solder joint and underfill technologies. FIG. 3B illustrates an example of a planar top view of the circuit package depicted in FIG. 3A. FIG. 3C illustrates a cross-sectional view of an example of components forming a portion of the circuit package depicted in FIG. 3A. FIG. 4A illustrates a cross-sectional view of an example of a circuit package using BoP, solder joint and molding compound technologies. FIG. 4B illustrates an example of a planar top view of the circuit package depicted in FIG. 4A.

The basic structure and characteristics of a circuit package 100BSU of FIGS. 3A-3C and a circuit package 100BSM of FIG. 4A-4B are the same or substantially similar to those of the circuit package 100BPU of FIGS. 1A-1C and the circuit package 100BPM of FIGS. 2A-2B, respectively, except as described herein.

Each of the circuit package 100BSU of FIGS. 3A-3C and the circuit package 100BSM of FIG. 4A-4B includes joints JT of FIG. 3C instead of the joints JT10P of FIG. 1C. Each joint JT10S of FIG. 3C includes solder SD10S but does not include any pillar or a pillar interface (e.g., does not include any Pillar10P or PI10P of FIG. 1C). In one or more implementations, the solder SD10S of FIG. 3C does not include copper.

Some examples of dimensions and materials of the various components shown in FIG. 3C are provided in Table 2 below. An example of a dimension between X microns and Y microns may be expressed as a dimension of X microns to Y microns, where X and Y are numbers.

TABLE 2

Figure 7A:
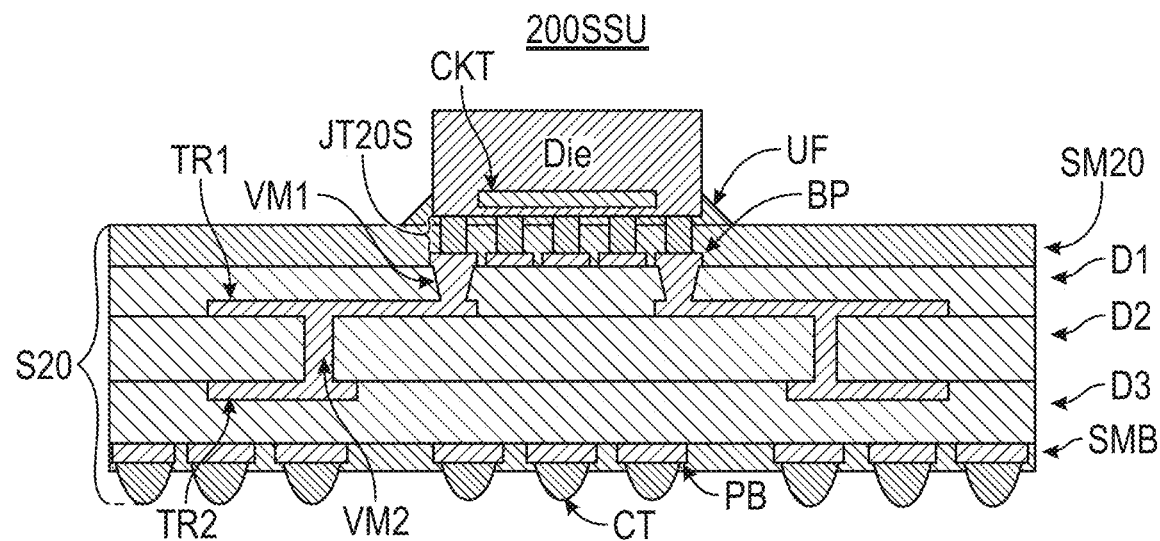
FIG. 7A illustrates a cross-sectional view of an example of a circuit package using SoP, solder joint and underfill technologies.
Figure 7B:
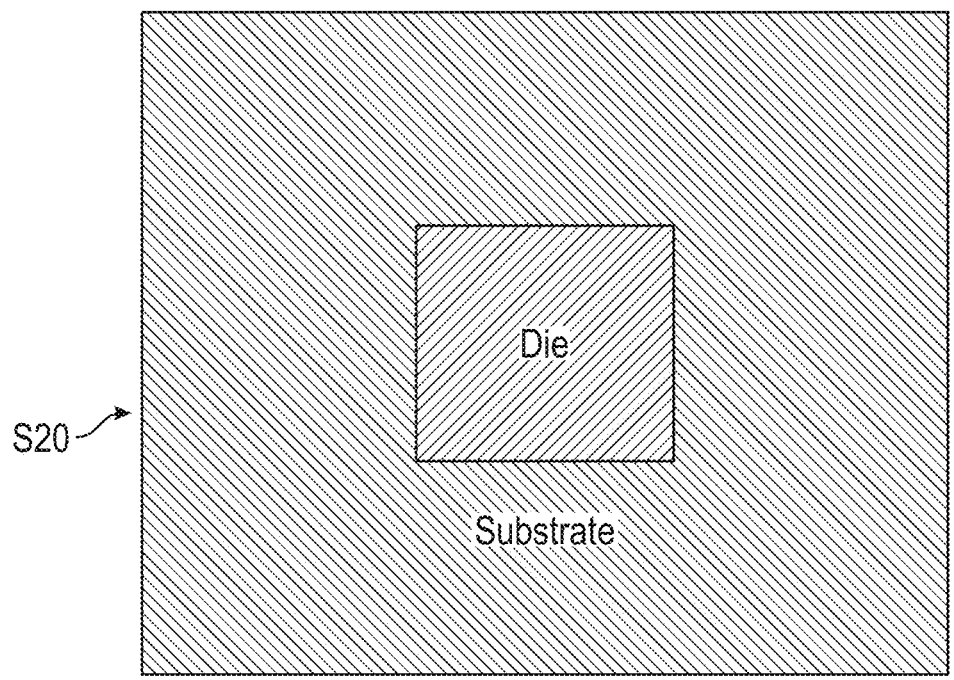
FIG. 7B illustrates an example of a planar top view of the circuit package depicted in FIG. 7A.
Figure 7C:
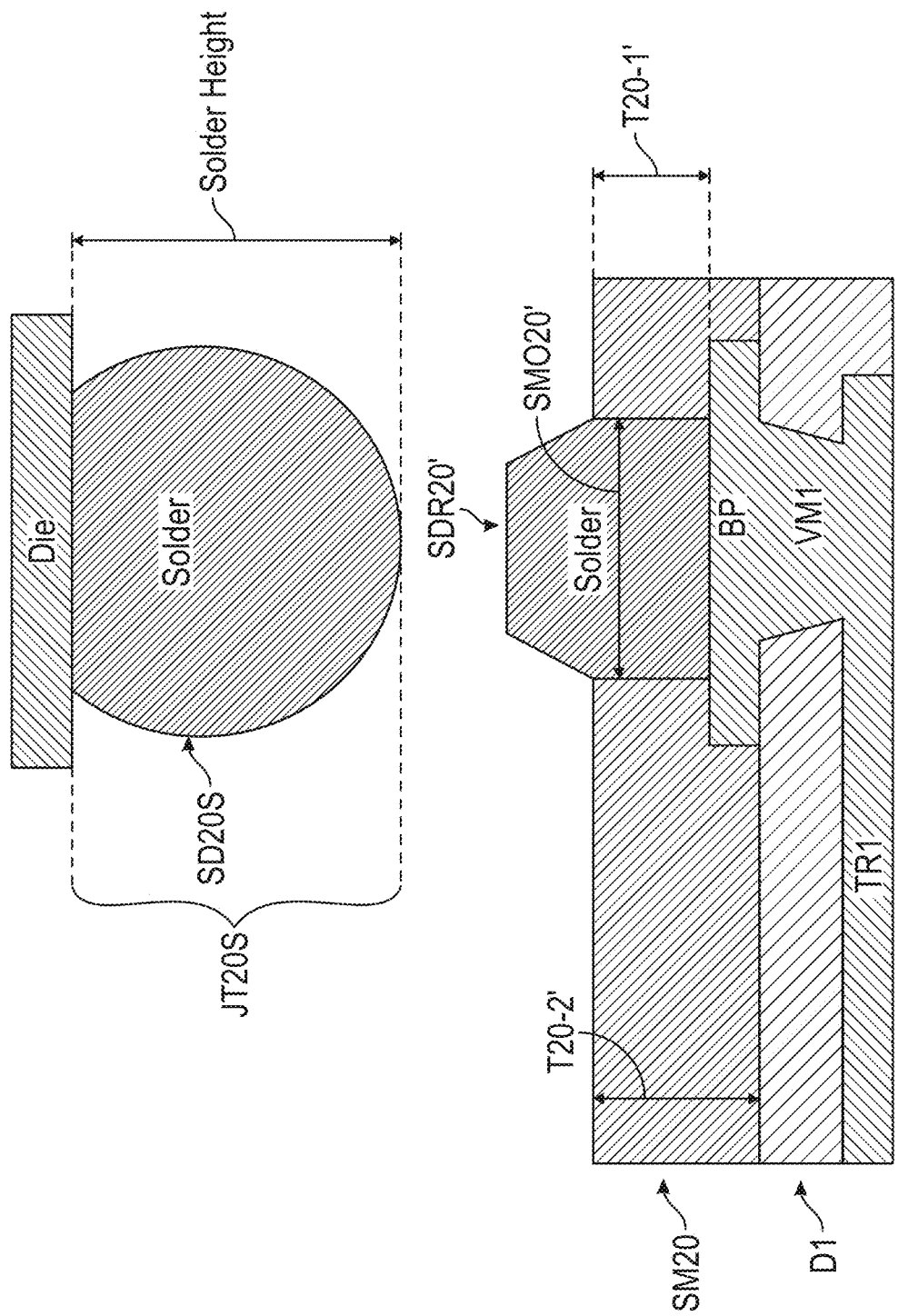
FIG. 7C illustrates a cross-sectional view of an example of components forming of forming a portion of the circuit package depicted in FIG. 7A.

| Component | Example Dimensions | Example Materials |
|---|---|---|
| Solder (SD10S) | Solder diameter (or solder's largest diameter): 100 microns; or 80 microns to 120 microns<br>Solder height: 80 microns; or 70 microns to 100 microns | tin; or tin and silver |
| First Opening (SMO10A') of First Solder Mask Layer (SM10A) | SMO10A': 85 microns; or 80 microns to 95 microns; and larger than SMO20' of FIG. 7C | N/A |
| First Thickness (T10-1') of Solder Mask (SM10) | T10-1': 27 microns; or 15 microns to 30 microns | N/A |
| Second Thickness (T10-2') of Solder Mask (SM10) | T10-2': 35 microns; or 25 microns to 40 microns | N/A |
| Thickness (T10A-1') of First Solder Mask Layer over First Portion of Bump Pad (BP) | T10A-1': 12 microns; or 5 microns to 15 microns; and less than T20-1' of FIG. 7C | N/A |
| Lateral gap between a joint (JT10S) and an adjacent joint (JT10S) | Lateral gap between two adjacent joints (JT10S): 40 microns; or 30 microns to 50 microns | N/A |

Figure 6A:
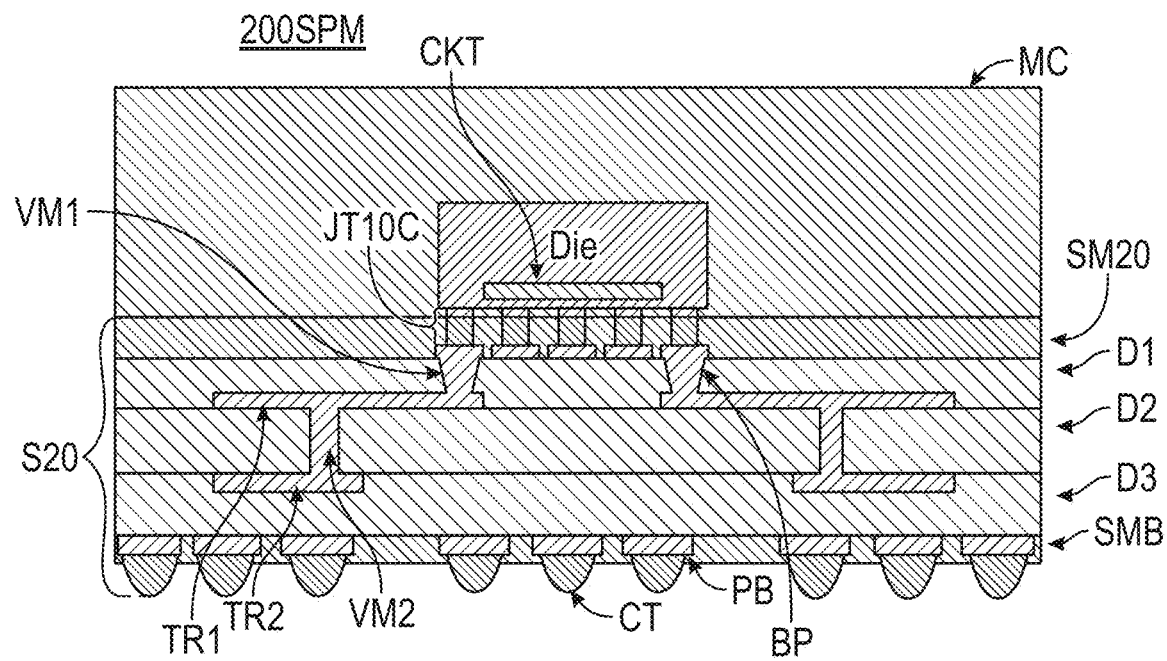
FIG. 6A illustrates a cross-sectional view of an example of a circuit package using SoP, pillar joint and molding compound technologies.
Figure 6B:
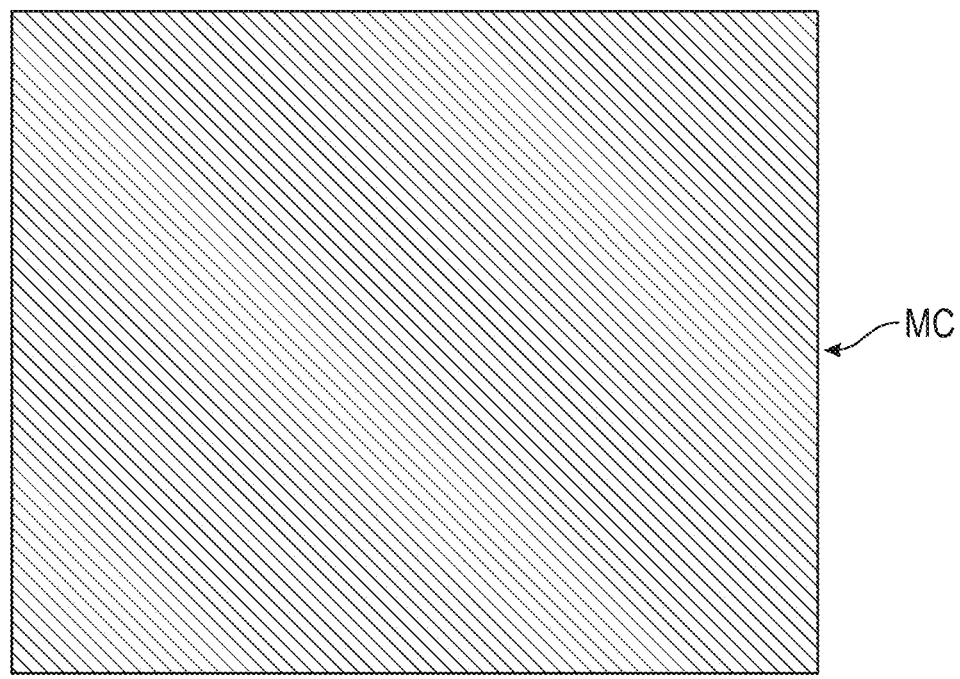
FIG. 6B illustrates an example of a planar top view of the circuit package depicted in FIG. 6A.
Figure 8A:
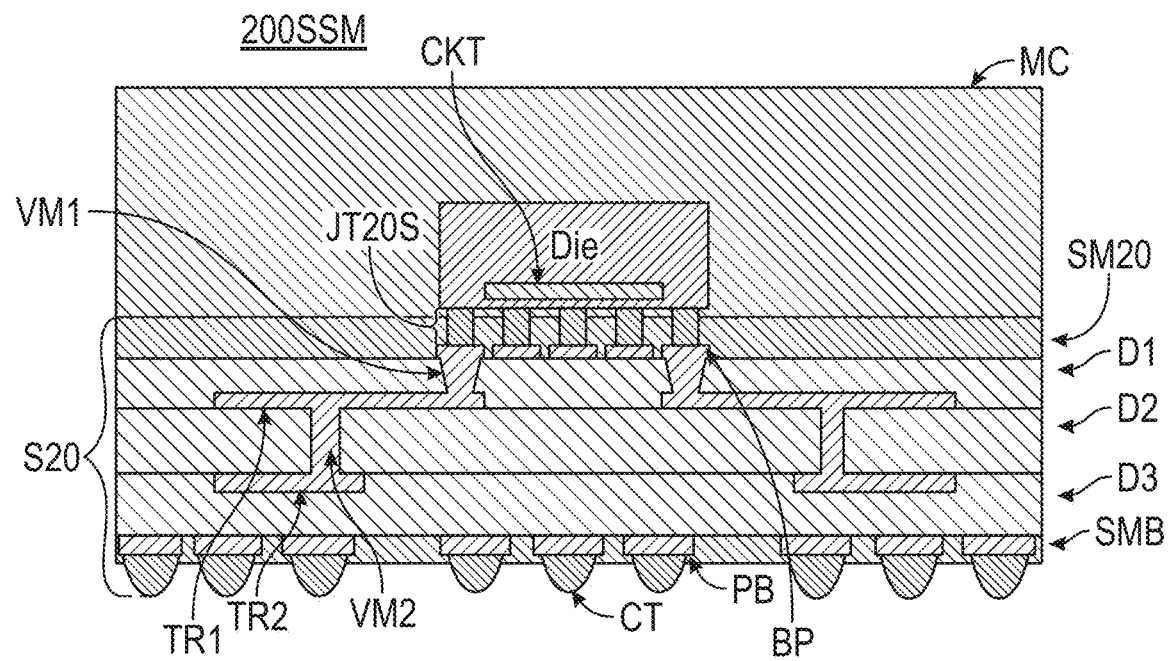
FIG. 8A illustrates a cross-sectional view of an example of a circuit package using SoP, solder joint and molding compound technologies.
Figure 8B:
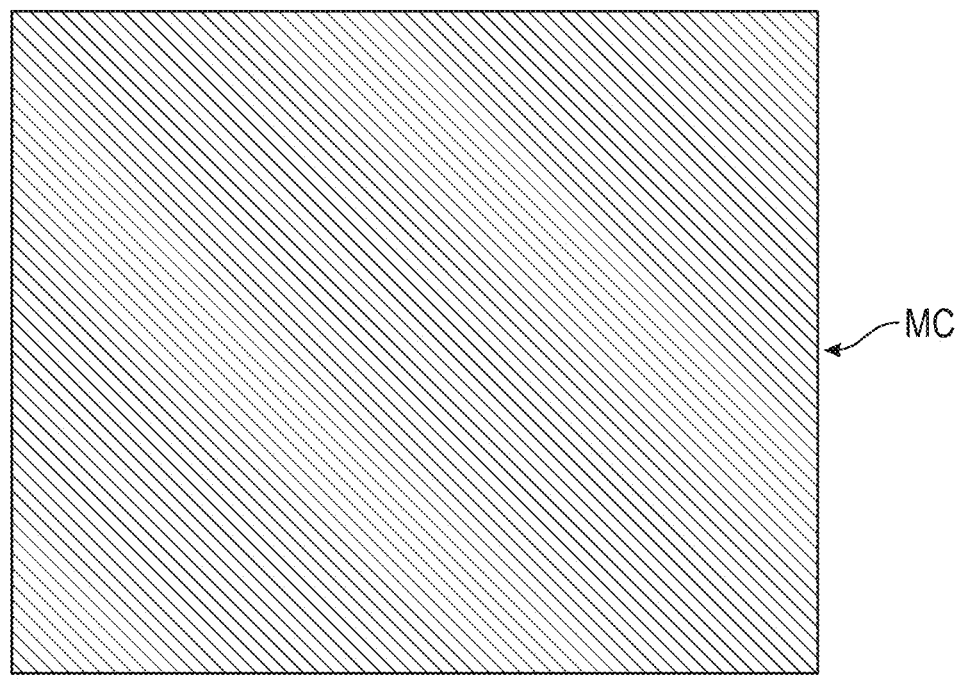
FIG. 8B illustrates an example of a planar top view of the circuit package depicted in FIG. 8A.

FIG. 5A illustrates a cross-sectional view of an example of a circuit package 200SPU using SoP, pillar joint and underfill technologies. FIG. 5B illustrates an example of a planar top view of the circuit package 200SPU depicted in FIG. 5A. FIG. 5C illustrates a cross-sectional view of an example of components forming a portion of the circuit package 200SPU depicted in FIG. 5A. FIG. 6A illustrates a cross-sectional view of an example of a circuit package 200SPM using SoP, pillar joint and molding compound technologies. FIG. 6B illustrates an example of a planar top view of the circuit package 200SPM depicted in FIG. 6A. FIG. 7A illustrates a cross-sectional view of an example of a circuit package 200SSU using SoP, solder joint and underfill technologies. FIG. 7B illustrates an example of a planar top view of the circuit package 200SSU depicted in FIG. 7A. FIG. 7C illustrates a cross-sectional view of an example of components forming a portion of the circuit package 200SSU depicted in FIG. 7A. FIG. 8A illustrates a cross-sectional view of an example of a circuit package 200SSM using SoP, solder joint and molding compound technologies. FIG. 8B illustrates an example of a planar top view of the circuit package 200SSM depicted in FIG. 8A.

The basic structure and characteristics of a circuit package 200SPU of FIGS. 5A-5C, a circuit package 200SPM of FIGS. 6A-6B, a circuit package 200SSU of FIGS. 7A-7C, and a circuit package 200SSM of FIGS. 8A-8B are similar to those of the circuit package 100BPU of FIGS. 1A-1C, the circuit package 100BPM of FIG. 2A-2B, the circuit package 100BSU of FIGS. 3A-3C, and the circuit package 100BSM of FIGS. 4A-4B, respectively, except as described herein.

The circuit packages illustrated in FIGS. 5A-5C, 6A-6B, 7A-7C and 8A-8B use the SoP technology, not the BoP technology. Prior to attaching joints JT20C or JT20S of FIG. 5C or 7C to their bump pads BP, each of the bump pads BP is covered by solder SDR20 or SDR20' as shown in FIG. 5C or 7C. Prior to attaching joints JT20C or JT20S to their bump pads BP, each of the bump pads BP may be covered by more than 80 microns of solder SDR20 or SDR20' (in thickness). Each of the bump pads BP is covered by solder SDR20 or SDR20' so that solder SDR20 or SDR20' is used to attach a joint JT20C or JT20S to its respective bump pad BP. Each solder SDR20 or SDR20' may be referred to as a solder bump.

The circuit package 200SPU of FIGS. 5A-5C includes joints JT20C of FIG. 5C (not the joints JT10P of FIG. 1C). The joint JT20C of FIG. 5C includes a pillar Pillar20C having copper and solder SC20C. The joint JT20C of FIG. 5C does not include a pillar interface PI10P of FIG. 1C. The height of solder SC10P of FIG. 1C is greater than the height of the solder SC20C of FIG. 5C.

The circuit package 200SPU of FIGS. 5A-5C includes a solder mask SM20 (not the solder mask SM10 of FIG. 1C). The solder mask SM20 is a single layer (not multiple layers). While the solder mask SM10 of FIG. 1C has two different thicknesses T10-1 and T10-2, each measured from the dielectric layer D1, the solder mask SM20 of FIG. 5C has one thickness T20-2 measured from the dielectric layer D1. The thickness T10-1 of FIG. 1C is thinner than the thickness T20-2 of FIG. 5C. In some examples, the thickness T10-2 of FIG. 1C may be the same or substantially the same as the thickness T20-2 of FIG. 5C. The thickness T10A-1 of FIG. 1C is thinner than the thickness T20-1 of FIG. 5C. The first opening SMO10A of FIG. 1C is larger than the opening SM020 in FIG. 5C.

Similar to the circuit package 200SPU of FIGS. 5A-5C, the circuit package 200SPM of FIGS. 6A-6B has a solder mask SM20 and joints JT20C. The circuit package 200SPM of FIGS. 6A-6B has a molding compound MC instead of an underfill UF.

Each of the circuit package 200SSU of FIGS. 7A-7C and the circuit package 200SSM of FIGS. 8A-8B includes a solder mask SM20 (not the solder mask SM10 of FIG. 3A or SM10A of FIG. 4A). Each of the circuit package 200SSU of FIGS. 7A-7C and the circuit package 200SSM of FIGS. 8A-8B includes joints JT20S of FIG. 7C (not joints JT10S of FIG. 3C). Each joint JT20S of FIG. 7C includes solder SD20S but does not include any pillar or a pillar interface (e.g., does not include any Pillar10P or PI10P of FIG. 1C). In one or more implementations, the solder SD20S of FIG. 7C does not include copper. In some examples, the height of the solder SD10S of FIG. 3C may be the same or substantially the same as the height of the solder SD20S of FIG. 7C.

In some examples, the diameter of the solder SD10S of FIG. 3C may be the same or substantially the same as the diameter of the solder SD20S of FIG. 7C. While the solder mask SM10 of FIG. 3C has two different thicknesses T10-1' and T10-2', each measured from the dielectric layer D1, the solder mask SM20 of FIG. 7C has one thickness T20-2' measured from the dielectric layer D1. The thickness T10-1' of FIG. 3C is thinner than the thickness T20-2' of FIG. 7C. In some examples, the thickness T10-2' of FIG. 3C may be the same or substantially the same as the thickness T20-2' of FIG. 7C. The thickness T10A-1' of FIG. 3C is thinner than the thickness T20-1' of FIG. 7C. In some examples, the first opening SMO10A' of FIG. 3C is larger than the opening SMO20' in FIG. 7C.

Some examples of dimensions and materials of the various components shown in FIG. 5C are provided in Table 3 below. An example of a dimension between X microns and Y microns may be expressed as a dimension of X microns to Y microns, where X and Y are numbers.

TABLE 3

| Component | Example Dimensions | Example Materials |
| --- | --- | --- |
| Pillar (Pillar20C) | Pillar diameter (or pillar's largest diameter): 80 microns; or 70 microns to 90 microns<br>Pillar height: 40 microns; or 25 microns to 55 microns | copper; or 99% copper |
| Solder Cap (SC20C) | Solder cap height: 15 microns; or 5 microns to 40 microns | tin; or tin and silver |
| Largest Diameter of Solder Bump (SDR20) | Solder bump (SDR20) diameter: 65 microns; or 25 microns to 100 microns | tin and copper; or tin, silver and copper |
| Height of Solder Bump (SDR20) | Solder bump (SDR20) height: 17.5 microns; or 5 microns to 30 microns | tin and copper; or tin, silver and copper |
| Bump Pad Diameter (BPD) (or Its Lateral Width, Lateral Length or Lateral Size) | BP diameter (BPD): 100 microns; or 80 microns to 110 microns | copper |
| Thickness of Bump Pad (BP) | Thickness of BP: 15 microns; or 10 microns to 23 microns | copper |
| Opening (SMO20) of Solder Mask (SM20) over Bump Pad (BP) | SMO20: 70 microns; or 60 microns to 80 microns | N/A |
| Thickness (T20-2) of Solder Mask (SM20) | T20-2: 35 microns; or 25 microns to 40 microns | N/A |
| Thickness (T20-1) of Solder Mask over First Portion of Bump Pad (BP) | T20-1: 21 microns; or 14 microns to 28 microns | N/A |
| Underfill (UF) | N/A | epoxy resin and silicon filler |
| Molding Compound (MC) | N/A | epoxy resin and silicon filler |
| Lateral gap between a joint (JT20C) and an adjacent joint (JT20C) | Lateral gap between two adjacent joints (JT20C): 50 microns; or 30 microns to 70 microns | N/A |

Some examples of dimensions and materials of the various components shown in FIG. 7C are provided in Table 4 below. An example of a dimension between X microns and Y microns may be expressed as a dimension of X microns to Y microns, where X and Y are numbers.

TABLE 4

| Component | Example Dimensions | Example Materials |
|---|---|---|
| Solder (SD20S) | Solder diameter (or solder's largest diameter): 100 microns; or 80 microns to 120 microns<br>Solder height: 80 microns; or 70 microns to 100 microns | tin; or tin and silver |
| Largest Diameter of Solder Bump (SDR20') | Solder bump (SDR20') diameter: 70 microns; or 25 microns to 120 microns | tin and copper; or tin, silver and copper |
| Height of Solder Bump (SDR20') | Solder bump (SDR20') height: 20 microns; or 5 microns to 30 microns | tin and copper; or tin, silver and copper |
| Opening (SMO20') of Solder Mask (SM20) over Bump Pad (BP) | SMO20': 80 microns; or 75 microns to 95 microns | N/A |
| Thickness (T20-2') of Solder Mask (SM20) | T20-2': 35 microns; or 25 microns to 40 microns | N/A |
| Thickness (T20-1') of Solder Mask over First Portion of Bump Pad (BP) | T20-1': 21 microns; or 14 microns to 28 microns | N/A |
| Lateral gap between a joint (JT20S) and an adjacent joint (JT20S) | Lateral gap between two adjacent joints (JT20S): 40 microns; or 30 microns to 70 microns | N/A |

In some examples, each of the bump pads BP of FIGS. 1C, 3C, 5C and 7C may have the same or similar diameter BPD and thickness.

Figure 9A:
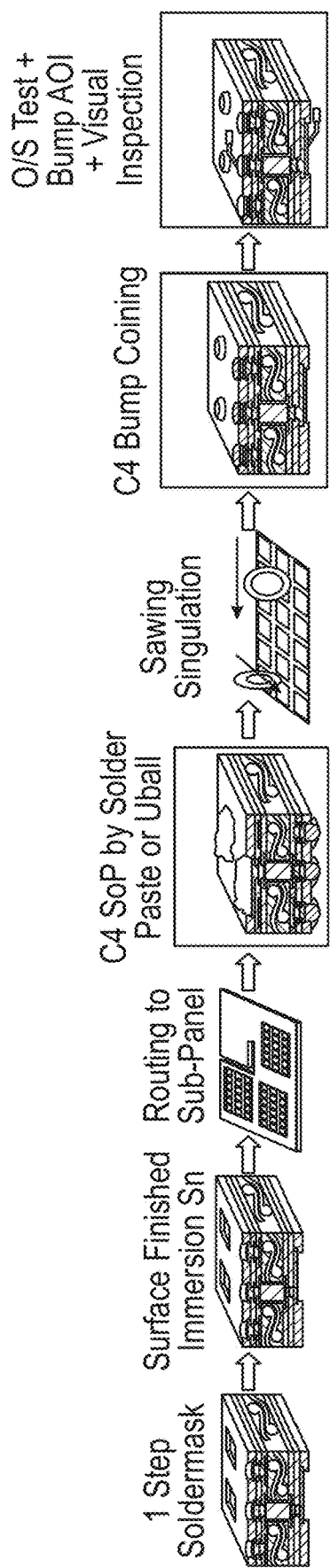
FIG. 9A illustrates an example of a manufacturing process of a substrate using the SoP technology.

FIG. 9A illustrates an example of a manufacturing process of a substrate using the SoP technology. A manufacturing process of a substrate using the SoP technology may involve the following operations: (i) forming a solder mask via a one-step process; (ii) forming a surface finish layer (e.g., immersion tin); (iii) routing the substrate to form sub-panels; (iv) forming solder bumps (e.g., solder SDR20 or SDR20' as shown in FIG. 5C or 7C) on the bump pads of the substrate using solder paste printing or micro-ball (µball) placement; (v) sawing to separate each substrate unit from a sub-panel; (vi) coining the solder bumps; and (vii) performing open/short (OA) tests, automated optical inspections (AOIs) of the solder bumps, and visual inspection of the resulting substrates.

Figure 9B:
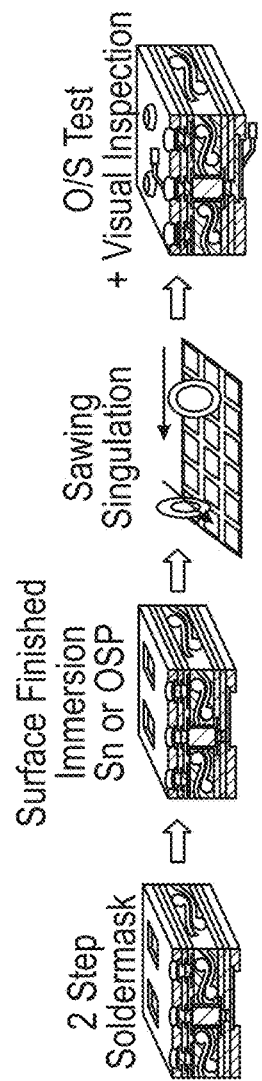
FIG. 9B illustrates an example of a manufacturing process of a substrate using the BoP technology.

FIG. 9B illustrates an example of a manufacturing process of a substrate using the BoP technology. A manufacturing process of a substrate using the BoP technology (rather than the SoP technology) is more efficient, and it can provide a shorter lead time, a better yield, a lower manufacturing cost, and no SoP capacity constraint. The process of FIG. 9B can remove several steps shown in FIG. 9A. For example, a process using the BoP technology can remove the steps of (iv) forming solder bumps, (vi) coining the solder bumps, and (vii) performing AOIs of the solder bumps. A manufacturing process of a substrate using the BoP technology may involve the following operations: (i) forming a solder mask via a two-step process (or a one-step process); (ii) forming a surface finish layer (e.g., immersion tin or OSP) on the bump pads; (iii) sawing to separate each substrate unit from a sub-panel; and (iv) performing open/short (OA) tests and visual inspection of the resulting substrates.

FIG. 9C is a table illustrating a comparison between process aspects of SoP and BoP. A manufacturing cycle time for a solder mask fabrication operation can involve a single-step process taking D days for SoP and a two-step process taking D+1 days for BoP. D may be a positive integer indicating the number of days. A manufacturing cycle time of a backend process can be D days for SoP and D-4 days for BoP (skipping the micro-ball, reflow, flux clean, bump coining and bump AOI steps). The yield performance of BoP is better than SoP. A SoP process can produce a yield loss at the solder bump AOI step. A yield loss may be due to inconsistent bump heights (BH), inconsistent bump diameters (BD) and/or inconsistent coplanarity (Coplan). For example, a yield loss may be due to inconsistent heights, diameters and/or coplanarity of SDR20 or SDR20'. A BoP process eliminates this yield loss as the BoP process does not require a solder bump AOI step. A substrate manufacturing cost of SoP involves the costs for an SoP process, its material and a non-recurring engineering cost of stencil. A BoP process does not have any cost relating to SoP or stencil but adds cost for the two-step solder mask fabrication operation. An SoP technology is a key bottleneck in a substrate manufacturing process. A BoP technology can eliminate this bottleneck.

FIG. 10A illustrates a flow diagram of an example of fabrication operations for a substrate using the BoP technology. A process 1000A may be utilized to manufacture a substrate such as a substrate S10U of FIGS. 1A-1C and 3A-3C. The process 1000A may begin with a substrate 1011A having dielectric layers D1-D3, bump pads BP, via metals VM1 and VM2, conductive traces TR1 and TR2, and pads PB at the bottom.

An operation 1010A may include coating a solder mask SM10A at or on the top side of the substrate and coating a solder mask SMB-A at or on the bottom side of the substrate. The solder masks SM10A and SMB-A may be coated simultaneously (e.g., using rollers on both sides). Alternatively, the solder masks SM10A and SMB-A may be coated one at a time serially. The solder mask SM10A may be coated on the dielectric layer D1 and on the bump pads. The solder mask SMB-A may be coated on the dielectric layer D3 and on the pads PB. A substrate 1021A is a result of the operation 1010A.

An operation 1020A may include exposing the solder masks SM10A and SMB-A to a light (e.g., a UV light). The solder mask SM10A may be exposed using a first pattern so that the solder mask SM10A can have a first opening (e.g., SMO10A, SMO10A') over each of the respective bump pads BP after the solder mask SM10A is developed at an operation 1050A. The solder mask SMB-A may be exposed using a second pattern so that the solder mask SMB-A can have openings to attach connectors CT to the pads PB after the solder mask SMB-A is developed at the operation 1050A. The exposure of the solder masks SM10A and SMB-A may be performed simultaneously or serially. A substrate 1031A is a result of the operation 1020A.

An operation 1030A may include coating a solder mask SM10B at or on the top side of the substrate and coating a solder mask SMB-B at or on the bottom side of the substrate. The solder masks SM10B and SMB-B may be coated simultaneously (e.g., using rollers on both sides). Alternatively, the solder masks SM10B and SMB-B may be coated serially. The solder mask SM10B may be coated on the solder mask SM10A. The solder mask SMB-B may be coated on the solder mask SMB-A. A substrate 1041A is a result of the operation 1030A.

An operation 1040A may include exposing the solder masks (including SM10B and SMB-B) to a light (e.g., a UV light). The solder mask SM10B may be exposed using a third pattern so that the solder mask SM10B can have a second opening over all of the bump pads BP after the solder mask SM10B is developed at an operation 1050A. The solder mask SMB-B may be exposed using the second pattern so that the solder mask SMB-B can have openings to attach the connectors CT to the pads PB after the solder mask SMB-B is developed at the operation 1050A. The exposure of the solder masks SM10B and SMB-B may be performed simultaneously or serially. A substrate 1051A is a result of the operation 1040A.

An operation 1050A may include developing the solder masks SM10A, SM10B, SMB-A and SMB-B. The solder masks SM10A and SM10B may form the solder masks SM10A and SM10B, respectively, of FIGS. 1A and 3A. The solder masks SMB-A and SMB-B may form the solder mask SMB of FIGS. 1A and 3A. A substrate 1061A is a result of the operation 1050A.

In one example, the exposure operations 1020A and 1040A may be performed using photomasks so that the patterns (e.g., the first, second and third patterns) may be the patterns on the photomasks. In another example, the exposure operations 1020A and 1040A may be performed by direct imaging without photomasks. In some examples, the solder masks SMB-A and SMB-B may be formed using a single-layer solder mask SMB.

FIG. 10B illustrates a flow diagram of another example of fabrication operations for a substrate using the BoP technology. A process 1000B may be utilized to manufacture a substrate such as a substrate S10M of FIGS. 2A and 4A, where the die is encapsulated by a molding compound. The process 1000B may begin with a substrate 1011B having dielectric layers D1-D3, bump pads BP, via metals VM1 and VM2, conductive traces TR1 and TR2, and pads PB at the bottom.

An operation 1010B may include coating a solder mask SM10A at or on the top side of the substrate and coating a solder mask SMB at or on the bottom side of the substrate. The solder masks SM10A and SMB may be coated simultaneously (e.g., using rollers on both sides). Alternatively, the solder masks SM10A and SMB may be coated serially. The solder mask SM10A may be coated on the dielectric layer D1 and on the bump pads BP. The solder mask SMB may be coated on the dielectric layer D3 and on the pads PB. In some examples, a solder mask coating operation may include laminating the solder mask(s). A substrate 1021B is a result of the operation 1010B.

An operation 1020B may include exposing the solder masks SM10A and SMB to a light (e.g., a UV light). The solder mask SM10A may be exposed using a first pattern so that the solder mask SM10A can have a first opening (e.g., SMO10A, SMO10A') over each of the respective bump pads BP after the solder mask SM10A is developed at an operation 1030B. The solder mask SMB may be exposed using a second pattern so that the solder mask SMB can have openings to attach connectors CT to the pads PB after the solder mask SMB is developed at the operation 1030B. The exposure of the solder masks SM10A and SMB may be performed simultaneously or serially. A substrate 1031B is a result of the operation 1020B.

An operation 1030B may include developing the solder masks SM10A and SMB. The solder masks SM10A and SMB may form the solder masks SM10A and SMB, respectively, of FIGS. 2A and 4A. A substrate 1041B is a result of the operation 1030B. The thickness of the solder mask SM10A measured from the top of the dielectric D1 may be smaller than the thickness of the solder mask SMB measured from the bottom of the dielectric D3.

In one example, the exposure operation 1020B may be performed using photomasks so that the patterns (e.g., the first and second patterns) may be the patterns on the photomasks. In another example, the exposure operation 1020B may be performed by direct imaging without photomasks.

Figure 10C:
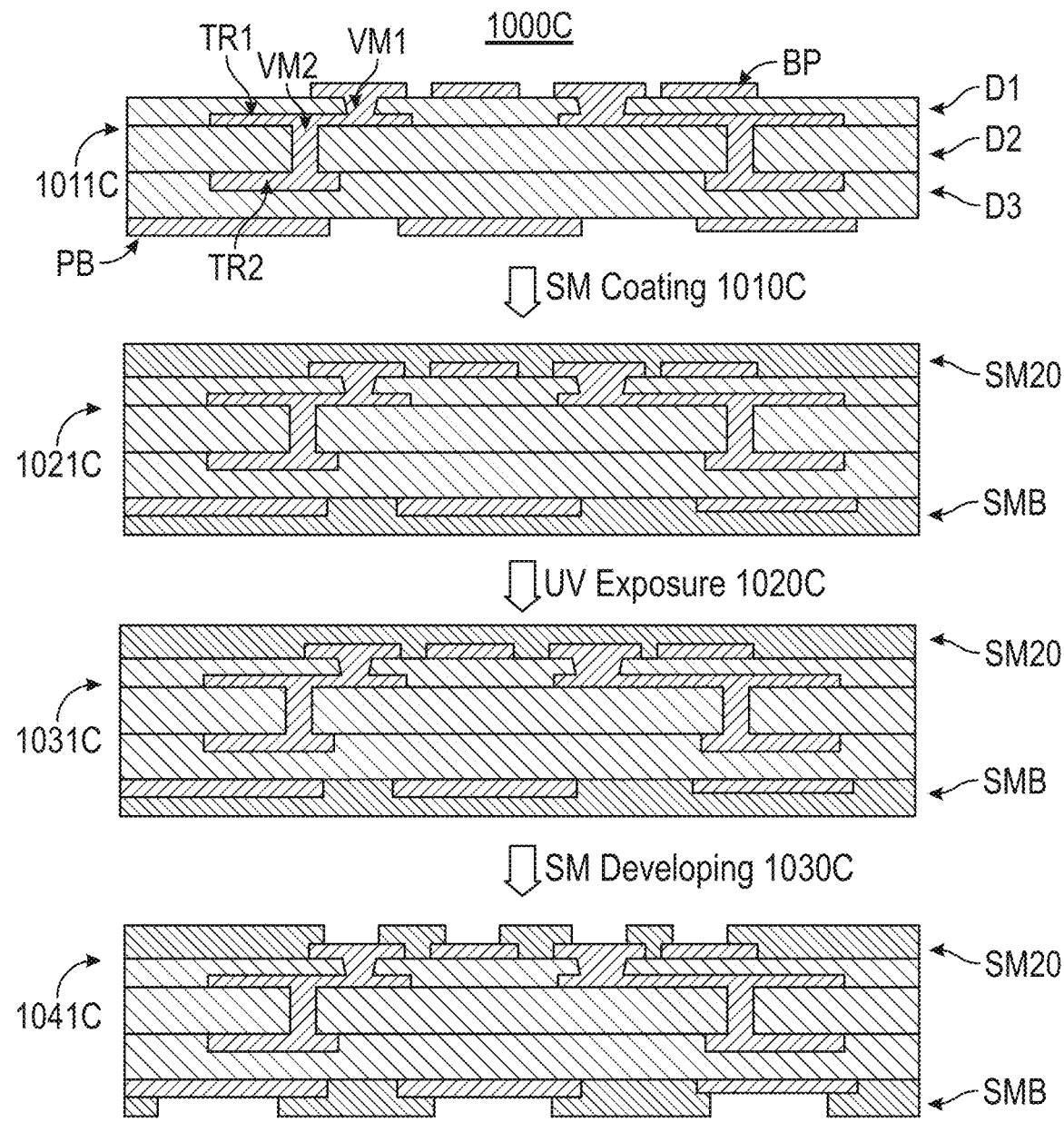
FIG. 10C illustrates a flow diagram of an example of fabrication operations for a substrate using the SoP technology.

FIG. 10C illustrates a flow diagram of an example of fabrication operations for a substrate using the SoP technology. A process 1000C may be utilized to manufacture a substrate such as a substrate S20 of FIGS. 5A, 6A, 7A and 8A. The process 1000C may begin with a substrate 1011C having dielectric layers D1-D3, bump pads BP, via metals VM1 and VM2, conductive traces TR1 and TR2, and pads PB at the bottom.

An operation 1010C may include coating a solder mask SM20 at or on the top side of the substrate and coating a solder mask SMB at or on the bottom side of the substrate. The solder masks SM20 and SMB may be coated simultaneously (e.g., using rollers on both sides). Alternatively, the solder masks SM20 and SMB may be coated serially. The solder mask SM20 may be coated on the dielectric layer D1 and on the bump pads BP. The solder mask SMB may be coated on the dielectric layer D3 and on the pads PB. A substrate 1021C is a result of the operation 1010C.

An operation 1020C may include exposing the solder masks SM20 and SMB to a light (e.g., a UV light). The solder mask SM20 may be exposed using a first pattern so that the solder mask SM20 can have an opening (e.g., SMO20, SMO20') over each of the respective bump pads BP after the solder mask SM20 is developed at an operation 1030C. The solder mask SMB may be exposed using a second pattern so that the solder mask SMB can have openings to attach connectors CT to the pads PB after the solder mask SMB is developed at the operation 1030C. The exposure of the solder masks SM20 and SMB may be performed simultaneously or serially. A substrate 1031C is a result of the operation 1020C.

An operation 1030C may include developing the solder masks SM20 and SMB. The solder masks SM20 and SMB may form the solder masks SM20 and SMB, respectively, of FIGS. 5A, 6A, 7A and 8A. A substrate 1041C is a result of the operation 1030C.

FIGS. 11A and 11B illustrate examples of actual cross-sectional pictures of a portion of a circuit package fabricated using the BoP technology.

FIG. 11A illustrates an example of a cross-sectional picture showing a portion of a die, a joint with a copper pillar and a solder cap, and a bump pad BP fabricated using the BoP technology. In this photo, the joint includes a copper pillar (e.g., Pillar10P of FIG. 1C) and a solder cap (e.g., SC10P of FIG. 1C). The joint, which is formed on the die, is attached to the bump pad BP. There is no solder bump on the bump pad BP used to attach the joint to the bump pad BP.

FIG. 11B illustrates an example of a cross-sectional picture showing a portion of a die, a joint with solder, and a bump pad BP fabricated using the BoP technology. In this photo, the joint includes solder (e.g., SD10S of FIG. 3C). The joint, which is formed on the die, is attached to the bump pad BP. There is no solder bump on the bump pad BP used to attach the joint to the bump pad BP.

FIGS. 12A and 12B illustrate examples of actual cross-sectional pictures of a portion of a circuit package fabricated using the SoP technology.

FIG. 12A illustrates an example of a cross-sectional picture of a portion of a die, a joint with a copper pillar and a solder cap, a solder bump, and a bump pad BP fabricated using the SoP technology. In this photo, the joint (e.g., JT20C of FIG. 5C) includes a copper pillar (e.g., Pillar20C of FIG. 5C) and a solder cap (e.g., SC20C of FIG. 5C). There is a solder bump (e.g., SDR20 of FIG. 5C) disposed on the bump pad BP to attach the joint to the bump pad BP. The solder bump is placed on the bump pad BP before the joint is attached to the bump pad BP. The joint formed on the die is attached to the bump pad BP using the solder bump.

FIG. 12A illustrates an example of a cross-sectional picture of a portion of a die, a joint with solder, a solder bump, and a bump pad BP fabricated using the SoP technology. In this photo, the joint (e.g., JT20S of FIG. 7C) includes solder (e.g., SD20S of FIG. 7C). There is a solder bump (e.g., SDR20' of FIG. 7C) disposed on the bump pad BP to attach the joint to the bump pad BP. The solder bump is placed on the bump pad BP before the joint is attached to the bump pad BP. The joint formed on the die is attached to the bump pad BP using the solder bump.

In one or more preferred implementations, an opening SMO10A is larger than an opening SMO20. In one or more preferred implementations, an opening SMO10A' is larger than an opening SMO20'. In one or more examples, an opening SMO10A is smaller than an opening SMO10A'. In one or more examples, an opening SMO20 is smaller than an opening SMO20'. In one or more examples, a diameter and a height of a solder bump SDR20 are the same or substantially the same as a diameter and a height, respectively, of a solder bump SDR20'. In one or more examples, a diameter and a height of a pillar Pillar10P are the same or substantially the same as a diameter and a height, respectively, of a pillar Pillar20C. In one or more examples, a diameter of a joint JT10P is the same or substantially the same as a diameter of a joint JT20C. In one or more examples, a height of a joint JT10P is greater than a height of a joint JT20C. In one or more examples, a diameter and a height of solder SD10S are the same or substantially the same as a diameter and a height, respectively, of solder SD20S. In one or more examples, a lateral distance between a center of a pillar Pillar10P and a center of an adjacent pillar Pillar10P (e.g., a pillar pitch) is about 130 microns or less. In one or more examples, a lateral distance between a center of solder SD10S and a center of an adjacent solder SD10S (e.g., a solder joint pitch) is about 150 microns or more. In one or more examples, a lateral distance between a center of a pillar Pillar20C and a center of an adjacent pillar Pillar20C may be about 130 microns or less. In one or more examples, a lateral distance between a center of solder SD20S and a center of an adjacent solder SD20S may be about 150 microns or more. In one or more examples, a lateral gap between two adjacent joints JT10P may be the same or less than a lateral gap between two adjacent joints JT10S. In one or more examples, a lateral gap between two adjacent joints JT20C may be the same or less than a lateral gap between two adjacent joints JT20S.

Various examples of aspects of the disclosure are described below for convenience. These are provided as examples, and do not limit the subject technology. Some of the examples described below are illustrated with respect to the figures disclosed herein simply for illustration purposes without limiting the scope of the subject technology.

One or more implementations provide a circuit package (e.g., 100BPU of FIG. 1A or 100BSU of FIG. 3A), including: a die (e.g., a die of FIG. 1A or 3A) including a first surface (e.g., a front surface of FIG. 1A) and a second surface (e.g., a back surface of FIG. 1A or 3A), the second surface being opposite to the first surface; a substrate (e.g., S10U of FIG. 1A or 3A) including: a dielectric layer (e.g., D1); a bump pad (e.g., BP) disposed on the dielectric layer; and a solder mask (e.g., SM10) disposed on the dielectric layer, the solder mask covering a first portion of the bump pad and uncovering a second portion of the bump pad (e.g., FIG. 1C); and a joint (e.g., JT10P of FIG. 1A or JT10S of FIG. 3C) located between the first surface of the die and the second portion of the bump pad, wherein: the joint is formed on the first surface of the die prior to being attached to the second portion of the bump pad; prior to the joint being attached to the second portion of the bump pad, the second portion of the bump pad is covered by less than two microns of solder, the solder including tin; the solder mask has a first thickness (e.g., T10-1 of FIG. 1C or T10-1' of FIG. 3C) and a second thickness (e.g., T10-2 of FIG. 1C or T10-2' of FIG. 3C) from the dielectric layer; the first thickness is less than the second thickness; and a portion of the solder mask having the first thickness is closer to the bump pad than a portion of the solder mask having the second thickness.

One or more examples provide that: prior to the joint being attached to the second portion of the bump pad, the bump pad contains no tin; the joint includes conductive material; the bump pad includes conductive material; and the solder mask includes dielectric material.

One or more examples provide that: the solder mask includes a first solder mask layer (e.g., SM10A of FIG. 1C or 3C) and a second solder mask layer (e.g., SM10B of FIG. 1C or 3C); the first solder mask layer is disposed on the dielectric layer and on the first portion of the bump pad; the second solder mask layer is disposed on the first solder mask layer; the first solder mask layer has a first opening (e.g., SMO10A of FIG. 1C or SMO10A' of FIG. 3C) in the second portion of the bump pad, wherein a size of the first opening is smaller than a size of the bump pad; and the second solder mask layer has a second opening over the bump pad, wherein a size of the second opening is larger than the size of the first opening and is larger than the size of the bump pad.

One or more examples provide that: the substrate includes a plurality of bump pads, the plurality of bump pads including the bump pad; the solder mask includes a first solder mask layer (e.g., SM10A of FIG. 1C or 3C) and a second solder mask layer (e.g., SM10B of FIG. 1C or 3C); the first solder mask layer is disposed on the dielectric layer and on a respective portion of each of the plurality of bump pads; the first solder mask layer occupies spaces between bump pads of the plurality of bump pads; the second solder mask layer is disposed on the first solder mask layer; the second solder mask layer does not occupy spaces between the bump pads of the plurality of bump pads; the first solder mask layer has a first opening (e.g., SMO10A of FIG. 1C or SMO10A' of FIG. 3C) over each one of the plurality of bump pads, wherein a size of the first opening is smaller than a size of each respective one of the plurality of bump pads; and the second solder mask layer has a second opening over the plurality of bump pads, wherein a size of the second opening is larger than a sum of the sizes of the first openings and is larger than a sum of the sizes of the plurality of bump pads.

One or more examples provide that: the joint is attached to the bump pad via a first opening in the solder mask; a second opening in the solder mask is over the bump pad; the first opening is closer to the bump pad than the second opening; and the second opening is larger than the first opening.

One or more examples provide that: the joint is attached to the bump pad via a first opening in the solder mask; a size of the first opening is between 60 microns and 90 microns; and a largest diameter of the joint is between 70 microns and 90 microns.

One or more examples provide that: the joint is attached to the bump pad via a first opening in the solder mask; the first opening has a first size; if the bump pad is covered by more than K microns of solder prior to the joint being attached to the second portion of the bump pad, an opening in the solder mask over the bump pad is to have a second size; and the first size is larger than the second size. In one example, K is 80. In another example, K is 90. In another example, K is 100. In another example, K is 70. In another example, K is 60. In another example, K is 50. In another example, K is 40. In another example, K is 30. In another example, K is 20. In another example, K is 10. In another example, K is 5. In another example, K is 3. In another example, K is 2. In another example, K is greater than 2.

One or more examples provide that: a thickness (e.g., T10A-1 of FIG. 1C or T10A-1' of FIG. 3C) of the solder mask over the first portion of the bump pad is between 5 microns and 15 microns.

One or more examples provide that: the solder mask has a third thickness over the first portion of the bump pad; if the bump pad is covered by more than K microns of solder prior to the joint being attached to the second portion of the bump pad, the solder mask is to have a fourth thickness over the first portion of the bump pad; and the third thickness is less than the fourth thickness. In one or more examples, K may be one of the values described above.

One or more examples provide that: a first region of the joint includes a copper pillar (e.g., Pillar10P of FIG. 1C); a second region of the joint includes solder (e.g., SC10P of FIG. 1C); and the first region is closer to the die than the second region.

One or more examples provide that: a third region of the joint includes nickel (e.g., PI10P of FIG. 1C); the third region is between the first and second regions; and the solder of the second region includes tin and silver.

One or more examples provide that: the joint (e.g., JT10S of FIG. 3C) includes solder and does not include a copper pillar.

One or more examples provide that: the die includes circuits at or near the first surface; the substrate includes a plurality of dielectric layers, wherein the plurality of dielectric layers includes the dielectric layer; the circuit package includes underfill; the circuit package includes a plurality of joints, wherein the plurality of joints includes the joint; the solder mask includes a first solder mask layer and a second solder mask layer; the second solder mask layer is stacked on the first solder mask layer; the underfill occupies spaces between joints of the plurality of joints; the underfill occupies an opening in the second solder mask layer; and the underfill is disposed on the first solder mask layer.

One or more implementations provide a circuit package (e.g., 100BPM of FIG. 2A or 100BSM of FIG. 4A) fabricated by: disposing a plurality of bump pads (e.g., BP) on a dielectric layer (e.g., DO of a substrate (e.g., SM10); forming a solder mask (e.g., SM10A) over the dielectric layer, the solder mask covering a first portion of each of the plurality of bump pads and uncovering a second portion of each of the plurality of bump pads; fabricating a plurality of joints (e.g., JT10P of FIG. 2A or JT10S of FIG. 4A) on a die; attaching the die to the substrate using the plurality of joints by attaching each of the plurality of joints to a respective one of the plurality of second portions of the plurality of bump pads, wherein: prior to attaching the die to the substrate, the second portion of each of the plurality of bump pads is covered by less than 2 microns of solder, the solder including tin; the solder mask has a first thickness over the first portion of each of the plurality of bump pads; if the second portion of each of the plurality of bump pads is covered by more than K microns of solder prior to the die being attached to the substrate, the solder mask is to have a second thickness over the first portion of each of the plurality of bump pads; and the first thickness is less than the second thickness. In one example, K is 10. In one or more examples, K may be one of the values described above.

One or more examples provide that: the first thickness of the solder mask over the first portion of the bump pad is between 5 microns and 15 microns.

One or more examples provide a circuit package further fabricated by: encapsulating the die with a molding compound, wherein: the molding compound is disposed on the solder mask; and the molding compound occupies spaces between joints of the plurality of joints.

One or more examples provide that: prior to the die being attached to the substrate, each of the plurality of bump pads contains no tin.

One or more examples provide that: each of the plurality of joints is attached to a respective one of the second portions of the plurality of bump pads via a respective first opening in the solder mask; a size of the respective first opening is between 60 microns and 90 microns; a largest diameter of each of the plurality of joints is between 70 microns and 90 microns; and the size of the respective first opening is smaller than the largest diameter of each of the plurality of joints.

One or more implementations provide a method of fabricating a circuit package (e.g., 100BPU of FIG. 1A or 100BSU of FIG. 3A), including: fabricating a substrate (e.g., S10U of FIG. 1A or 3A), including: providing a dielectric layer (e.g., D1); disposing a plurality of bump pads (e.g., BP) on the dielectric layer; and forming a solder mask (e.g., SM10) over the dielectric layer, the solder mask covering a first portion of each of the plurality of bump pads and uncovering a second portion of each of the plurality of bump pads; fabricating a plurality of joints (e.g., JT10P of FIG. 1A or JT10S of FIG. 3C) on a die; and attaching the die to the substrate using the plurality of joints by attaching each of the plurality of joints to a respective one of the second portions of the plurality of bump pads, wherein: prior to attaching the die to the substrate, the second portion of each of the plurality of bump pads is covered by less than two microns of solder, the solder including tin; the solder mask has a first thickness and a second thickness, each measured from the dielectric layer; the first thickness is less than the second thickness; and a portion of the solder mask having the first thickness is closer to the plurality of bump pads than a portion of the solder mask having the second thickness.

One or more examples provide that: forming the solder mask includes: coating a first solder mask layer (e.g., SM10A of FIG. 10A) on the dielectric layer and the plurality of bump pads (e.g., 1010A of FIG. 10A); providing a first light exposure to the first solder mask layer (e.g., 1020A of FIG. 10A); coating a second solder mask layer (e.g., SM10B) on the first solder mask layer (e.g., 1030A of FIG. 10A); providing a second light exposure to the second solder mask layer (e.g., 1040A of FIG. 10A); and developing the first and second solder mask layers (e.g., 1050A of FIG. 10A) to provide a first opening in the first solder mask layer over each of the plurality of bump pads and to provide a second opening in the second solder mask layer, wherein: the solder mask includes the first solder mask layer and the second solder mask layer; a size of the second opening is larger than a sum of sizes of the first openings and is larger than a sum of sizes of the plurality of bump pads; and attaching the die to the substrate includes applying heat to the plurality of joints and the second portions of the plurality of bump pads to allow solder in the plurality of joints to reflow.

For the components described herein, the number of each component that may be used with the subject technology is not limited to those shown herein. Other numbers of components are within the scope of the subject technology. For example, while FIG. 1A depicts one die, five joints JT10P, five bump pads BP, three dielectric layers D1-D3, four via metals, four conductive traces, two solder mask layers on a top side, and one solder mask layer on a bottom side, nine pads PB at the bottom and nine connectors CT, one or more implementations can include a fewer number of these components or a greater number of these components.

In one or more examples, a front surface may be referred to as a first surface or a first side, and a back surface may be referred to as a second surface or a second side, and vice versa. A top side may be referred to as a first side or a first surface, and a bottom side may be referred to as a second side or a second surface, and vice versa. In some examples, an underfill may be a capillary underfill. In some examples, a solder mask may be referred to as a solder resist. In one or examples, a joint may be a controlled collapse-chip-connection (C4) bump joint.

In one or more examples, transistors may include, for example, one or more of the following: (i) one or more bipolar junction transistors (BJTs); and (ii) one or more field effect transistors (FETs), including, but not limited to, a metal oxide semiconductor field effect transistor (MOSFET), a junction FET (JFET), a metal semiconductor FET (MESFET), a high electron mobility transistor (HEMT), and a modulation doped FET (MODFET). Unless otherwise mentioned, a die may be formed using a silicon, silicon-germanium (SiGe), gallium arsenide (GaAs), indium phosphide (InP) or indium gallium phosphide (InGaP) wafter substrate, or any other suitable wafer substrate.

In one or more examples, the terms "contact" and "via" may both refer to structures in a substrate or a die used for electrical connection of conductors, for example, for different interconnect levels of a substrate or a die. These terms can describe both an opening in an insulator in which the structure will be completed as well as the completed structure itself.

In one or more examples, a "substrate" may be a physical object that is the basic work piece transformed by various process operations into the desired microelectronic configuration. A substrate may be a printed circuit board or another type of substrate. A die may be a region of a wafer. A wafer may be cut or sawed to provide individual dies. Wafers may be made of semiconducting (e.g., bulk silicon), non-semiconducting (e.g., glass), or combinations of semiconducting and non-semiconducting materials (e.g., silicon-on-insulator (SOI)). In the semiconductor industry, a bulk silicon wafer is commonly used for the manufacture of integrated circuits.

In the semiconductor industry environment of foundries and fabless companies, the foundries develop, specify, and provide the physical structures that designers use to implement their designs. Foundries provide manufacturing services to many fabless semiconductor companies, but to operate profitably they optimize their manufacturing processes to achieve high yields. Such optimizations generally require that limitations be placed on the variety of structures that can be produced by a particular manufacturing process. Consistent with the foregoing, foundries typically provide a limited set of transistor structures that are intended to cover a broad range of circuit applications.

The terms "configured to" and "operable to" do not imply any particular tangible or intangible modification of a subject, but, rather, are intended to be used interchangeably. The terms such as "top," "middle," "bottom," "front," "rear," "back," "side," "horizontal," "vertical," and the like refer to an arbitrary frame of reference, rather than to the ordinary gravitational frame of reference. Thus, such a term may extend upwardly, downwardly, diagonally, or horizontally in a gravitational frame of reference. The terms "on," "above," "over," "below," "under," and the like refer to an arbitrary frame of reference, rather than to the ordinary gravitational frame of reference. These terms may refer to directly or indirectly "on," "above," "over," "below," "under," and the like, respectively, unless stated otherwise (e.g., a term such as "just" or "direct(ly)" is used). The terms "coupled," "connected," "attached," and the like may refer to directly or indirectly "coupled," "connected," "attached," and the like, respectively, unless stated otherwise (e.g., a term such as "just" or "direct(ly)" is used). The terms "rows," "columns" and the like refer to an arbitrary frame of reference, and they may refer to horizontal or vertical rows or columns.

A reference to an element in the singular is not intended to mean "one and only one" unless specifically so stated, but rather "one or more." For example, "a" component may refer to one or more components. An element proceeded by "a," "an," "the," or "said" does not, without further constraints, preclude the existence of additional same elements. Unless specifically stated otherwise, the term "some" refers to one or more. Furthermore, while the subject disclosure may provide many example ranges, sizes, dimensions and values, these are non-limiting examples, and other ranges, sizes, dimensions and values are within the scope of the subject technology.

Headings and subheadings, if any, are used for convenience only and do not limit the invention. The word "exemplary" is used to mean serving as an example or illustration. Any implementation described herein as an "example" is not necessarily to be construed as preferred or advantageous over other implementations. To the extent that the term "include," "have," or the like is used, such term is intended to be inclusive in a manner similar to the term "comprise" as "comprise" is interpreted when employed as a transitional word in a claim. Relational terms such as first and second and the like may be used simply for ease of understanding without necessarily requiring or implying any actual relationship or order between elements or actions and without necessarily requiring or implying that they have different characteristics unless stated otherwise.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A phrase "at least one of" preceding a series of items, with the terms "and" or "or" to separate any of the items, modifies the list as a whole, rather than each member of the list. The phrase "at least one of" does not require selection of at least one item; rather, the phrase allows a meaning that includes at least one of any one of the items, and/or at least one of any combination of the items, and/or at least one of each of the items. By way of example, each of the phrases "at least one of A, B, and C" and "at least one of A, B, or C" refers to only A, only B, or only C; any combination of A, B, and C; and/or at least one of each of A, B, and C.

It is understood that the specific order or hierarchy of steps, operations, or processes disclosed is an illustration of exemplary approaches. Unless explicitly stated otherwise, it is understood that the specific order or hierarchy of steps, operations, or processes may be performed in different order. Some of the steps, operations, or processes may be performed simultaneously. The accompanying method claims, if any, present elements of the various steps, operations or processes in a sample order, and are not meant to be limited to the specific order or hierarchy presented. These may be performed in serial, linearly, in parallel or in different order.

The disclosure is provided to enable any person skilled in the art to practice the various aspects described herein. In some instances, structures and components are shown in block diagram form in order to avoid obscuring the concepts of the subject technology. The disclosure provides various examples of the subject technology, and the subject technology is not limited to these examples. Various modifications to these aspects will be readily apparent to those skilled in the art, and the principles described herein may be applied to other aspects.

All structural and functional equivalents to the elements of the various aspects described throughout the disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples, and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter. The claims are not intended to be limited to the aspects described herein, but are to be accorded the full scope consistent with the claim language and to encompass all legal equivalents. Notwithstanding, none of the claims are intended to embrace subject matter that fails to satisfy the requirements of the applicable patent law, nor should they be interpreted in such a way.

What is claimed is:

1. A circuit package, comprising:
   a die comprising a first surface and a second surface, the second surface being opposite to the first surface;
   a substrate comprising:
      a dielectric layer;
      a bump pad disposed on a surface of the dielectric layer; and
      a solder mask disposed on the surface of the dielectric layer, the solder mask covering a first portion of the bump pad and uncovering a second portion of the bump pad; and
   a joint located between the first surface of the die and the second portion of the bump pad,
   wherein:
   a first portion of the solder mask has a first thickness between a first surface of the solder mask in contact with the surface of the dielectric layer and a first portion of a second surface of the solder mask opposite the first surface of the solder mask;
   a second portion of the solder mask has a second thickness between the first surface of the solder mask and a second portion of the second surface of the solder;
   the first thickness is less than the second thickness; and
   the first portion of the solder mask having the first thickness is closer to the bump pad than the second portion of the solder mask having the second thickness.

2. The circuit package of claim 1, wherein:
   the joint comprises conductive material;
   the bump pad comprises conductive material; and
   the solder mask comprises dielectric material.

3. The circuit package of claim 1, wherein:
   the solder mask comprises a first solder mask layer and a second solder mask layer;
   the first solder mask layer is disposed on the surface of the dielectric layer and on the first portion of the bump pad;
   the second solder mask layer is disposed on the first solder mask layer;
   the first solder mask layer has a first opening exposing the second portion of the bump pad, wherein a size of the first opening is smaller than a size of the bump pad; and
   the second solder mask layer has a second opening over the bump pad, wherein a size of the second opening is larger than the size of the first opening and is larger than the size of the bump pad.

4. The circuit package of claim 1, wherein:
   the substrate comprises a plurality of bump pads, the plurality of bump pads comprising the bump pad;
   the solder mask comprises a first solder mask layer and a second solder mask layer;
   the first solder mask layer is disposed on the dielectric layer and on a respective portion of each of the plurality of bump pads;
   the first solder mask layer occupies spaces between bump pads of the plurality of bump pads;
   the second solder mask layer is disposed on the first solder mask layer;
   the second solder mask layer does not occupy spaces between the bump pads of the plurality of bump pads;
   the first solder mask layer has a first opening over each one of the plurality of bump pads, wherein a size of the first opening is smaller than a size of each respective one of the plurality of bump pads; and
   the second solder mask layer has a second opening over the plurality of bump pads, wherein a size of the second opening is larger than a sum of the sizes of the first openings and is larger than a sum of the sizes of the plurality of bump pads.

5. The circuit package of claim 1, wherein:
   the joint is attached to the bump pad via a first opening in the solder mask;

a second opening in the solder mask is over the bump pad;
the first opening is closer to the bump pad than the second opening; and
the second opening is larger than the first opening.

6. The circuit package of claim 1, wherein:
the joint is attached to the bump pad via a first opening in the solder mask;
a size of the first opening is between 60 microns and 90 microns; and
a largest diameter of the joint is between 70 microns and 90 microns.

7. The circuit package of claim 1, wherein:
the joint is attached to the bump pad via a first opening in the solder mask;
the first opening has a first size;
if the bump pad is covered by more than 30 microns of solder prior to the joint being attached to the second portion of the bump pad, an opening in the solder mask over the bump pad is to have a second size; and
the first size is larger than the second size.

8. The circuit package of claim 1, wherein:
a thickness of the solder mask over the first portion of the bump pad is between 5 microns and 15 microns.

9. The circuit package of claim 1, wherein:
the solder mask has a third thickness over the first portion of the bump pad;
if the bump pad is covered by more than 30 microns of solder prior to the joint being attached to the second portion of the bump pad, the solder mask is to have a fourth thickness over the first portion of the bump pad; and
the third thickness is less than the fourth thickness.

10. The circuit package of claim 1, wherein:
a first region of the joint comprises a copper pillar;
a second region of the joint comprises solder; and
the first region is closer to the die than the second region.

11. The circuit package of claim 10, wherein:
a third region of the joint comprises nickel;
the third region is between the first and second regions; and
the solder of the second region comprises tin and silver.

12. The circuit package of claim 1, wherein:
the joint comprises solder and does not comprise a copper pillar.

13. The circuit package of claim 1, wherein:
the die comprises circuits at or near the first surface;
the substrate comprises a plurality of dielectric layers, wherein the plurality of dielectric layers comprises the dielectric layer;
the circuit package comprises underfill;
the circuit package comprises a plurality of joints, wherein the plurality of joints comprises the joint;
the solder mask comprises a first solder mask layer and a second solder mask layer;
the second solder mask layer is stacked on the first solder mask layer;
the underfill occupies spaces between joints of the plurality of joints;
the underfill occupies an opening in the second solder mask layer; and
the underfill is disposed on the first solder mask layer.

14. A circuit package fabricated by:
disposing a plurality of bump pads on a dielectric layer of a substrate;
forming a solder mask over the dielectric layer, the solder mask covering a first portion of each of the plurality of bump pads and uncovering a second portion of each of the plurality of bump pads;
fabricating a plurality of joints on a die; and
attaching the die to the substrate using the plurality of joints by attaching each of the plurality of joints to a respective one of the second portions of the plurality of bump pads,
wherein:
the solder mask has a thickness between a first surface of the solder mask in contact with the first portion of each of the plurality of bump pads and a second surface of the solder mask opposite the first surface; and
the thickness of the solder mask is based on an amount of solder disposed on the second portion of each of the plurality of bump pads prior to the die being attached to the substrate.

15. The circuit package of claim 14, wherein:
the thickness of the solder mask over the first portion of the bump pad is between 5 microns and 15 microns.

16. The circuit package of claim 14, further fabricated by:
encapsulating the die with a molding compound,
wherein:
the molding compound is disposed on the solder mask; and
the molding compound occupies spaces between joints of the plurality of joints.

17. The circuit package of claim 14, wherein:
if the amount of solder disposed on the second portion of each of the plurality of bump pads is more than 10 microns thick prior to the die being attached to the substrate, the thickness of the solder mask is greater than the thickness of the solder mask if the amount of solder disposed on the second portion of each of the plurality of bump pads is not greater than 10 microns thick.

18. The circuit package of claim 14, wherein:
each of the plurality of joints is attached to a respective one of the second portions of the plurality of bump pads via a respective first opening in the solder mask;
a size of the respective first opening is between 60 microns and 90 microns;
a largest diameter of each of the plurality of joints is between 70 microns and 90 microns; and
the size of the respective first opening is smaller than the largest diameter of each of the plurality of joints.

19. A method of fabricating a circuit package, comprising:
fabricating a substrate, comprising:
providing a dielectric layer;
disposing a plurality of bump pads on the dielectric layer; and
forming a solder mask over the dielectric layer, the solder mask covering a first portion of each of the plurality of bump pads and uncovering a second portion of each of the plurality of bump pads;
fabricating a plurality of joints on a die; and
attaching the die to the substrate using the plurality of joints by attaching each of the plurality of joints to a respective one of the second portions of the plurality of bump pads,
wherein:
prior to attaching the die to the substrate, the second portion of each of the plurality of bump pads is covered by less than two microns of solder, the solder comprising tin;
the solder mask has a first thickness and a second thickness, each measured from the dielectric layer;

the first thickness is less than the second thickness; and a portion of the solder mask having the first thickness is closer to the plurality of bump pads than a portion of the solder mask having the second thickness.

20. The method of claim 19, wherein:

forming the solder mask comprises:
- coating a first solder mask layer on the dielectric layer and the plurality of bump pads;
- providing a first light exposure to the first solder mask layer;
- coating a second solder mask layer on the first solder mask layer;
- providing a second light exposure to the second solder mask layer; and
- developing the first and second solder mask layers to provide a first opening in the first solder mask layer over each of the plurality of bump pads and to provide a second opening in the second solder mask layer, wherein:

the solder mask comprises the first solder mask layer and the second solder mask layer;

a size of the second opening is larger than a sum of sizes of the first openings and is larger than a sum of sizes of the plurality of bump pads; and attaching the die to the substrate comprises applying heat to the plurality of joints and the second portions of the plurality of bump pads to allow solder in the plurality of joints to reflow.

* * * * *